US009601617B2

(12) United States Patent
Yuan et al.

(10) Patent No.: US 9,601,617 B2
(45) Date of Patent: Mar. 21, 2017

(54) FABRICATION OF A TRANSISTOR INCLUDING A TUNNELING LAYER

(71) Applicant: QUALCOMM Incorporated, San Diego, CA (US)

(72) Inventors: Jun Yuan, San Diego, CA (US); Xia Li, San Diego, CA (US); Bin Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 14 days.

(21) Appl. No.: 14/604,544

(22) Filed: Jan. 23, 2015

(65) Prior Publication Data

US 2016/0218211 A1    Jul. 28, 2016

(51) Int. Cl.
| | |
|---|---|
| *H01L 29/78* | (2006.01) |
| *H01L 29/161* | (2006.01) |
| *H01L 29/66* | (2006.01) |
| *H01L 29/51* | (2006.01) |
| *H01L 29/49* | (2006.01) |
| *H01L 21/28* | (2006.01) |
| *H01L 29/739* | (2006.01) |

(52) U.S. Cl.
CPC .... *H01L 29/7827* (2013.01); *H01L 21/28079* (2013.01); *H01L 21/28088* (2013.01); *H01L 29/161* (2013.01); *H01L 29/4958* (2013.01); *H01L 29/4966* (2013.01); *H01L 29/517* (2013.01); *H01L 29/518* (2013.01); *H01L 29/66356* (2013.01); *H01L 29/66666* (2013.01); *H01L 29/66977* (2013.01); *H01L 29/7391* (2013.01)

(58) Field of Classification Search
CPC  H01L 21/02532; H01L 29/161; H01L 29/827
USPC .............................................................. 257/9
See application file for complete search history.

(56) References Cited

U.S. PATENT DOCUMENTS

| | | | | |
|---|---|---|---|---|
| 5,292,393 | A | * | 3/1994 | Maydan ............ H01L 21/67201 118/715 |
| 6,943,407 | B2 | * | 9/2005 | Ouyang .......... H01L 21/823807 257/329 |
| 8,058,687 | B2 | | 11/2011 | Tai et al. |
| 2012/0223387 | A1 | | 9/2012 | Cui et al. |
| 2012/0298960 | A1 | * | 11/2012 | Nayfeh ............... H01L 29/0847 257/27 |

(Continued)

FOREIGN PATENT DOCUMENTS

| | | |
|---|---|---|
| CN | 103560152 A | 2/2014 |
| DE | 102004041554 A1 | 3/2006 |

OTHER PUBLICATIONS

International Search Report and Written Opinion—PCT/US2016/013180—ISA/EPO—Aug. 11, 2016.

(Continued)

*Primary Examiner* — Kenneth Parker
*Assistant Examiner* — Warren H Kilpatrick
(74) *Attorney, Agent, or Firm* — Toler Law Group, PC

(57) ABSTRACT

In a particular embodiment, an apparatus includes an electron tunnel structure. The electron tunnel structure includes a tunneling layer, a channel layer, a source layer, and a drain layer. The tunneling layer and the channel layer are positioned between the source layer and the drain layer. The transistor device further includes a high-k dielectric layer adjacent to the electron tunnel structure.

30 Claims, 28 Drawing Sheets

(56) References Cited

U.S. PATENT DOCUMENTS

2013/0095623 A1* 4/2013 Guo ............... H01L 29/4983
                                                              438/268
2015/0014633 A1    1/2015 Daley et al.

OTHER PUBLICATIONS

Lima L.P.B., et al., "Metal Gate Work Function Tuning by Al Incorporation in TiN", Journal of Applied Physics, American Institute of Physics, US, XP012182229, Feb. 21, 2014 (Feb. 21, 2014), vol. 115, No. 7, pp. 074504-1-5, ISSN: 0021-8979, DOI: 10.1063/1.4866323.

Burusie A.D., et al., "In-Built N+ Pocket p-n-p-n Tunnel Field-Effect Transistor", IEEE Electron Device Letters, IEEE Service Center, New York, NY, US, vol. 35, No. 12, Dec. 1, 2014 (Dec. 1, 2014), pp. 1170-1172, XP011565024, ISSN: 0741-3106, DOI: 10.1109/LED.2014.2362926 [retrieved on Nov. 20, 2014].

Cui N., et al., "A PNPN Tunnel Field-Effect Transistor with High-K Gate and Low-K Fringe Dielectrics", Journal of Semiconductors, vol. 33, No. 8, Aug. 1, 2012 (Aug. 1, 2012), p. 084004, XP055265061, GB; CN ISSN: 1674-4926, DOI: 10.1088/1674-4926/33/8/084004.

Hansch W., et al., "A Vertical MOS-Gated Esaki Tunneling Transistor in Silicon", Thin Solid Films, Elsevier-Sequoia S.A. Lausanne, CH, vol. 369, No. 1-2, Jul. 1, 2000 (Jul. 1, 2000), pp. 387-389, XP004200396, ISSN: 0040-6090, DOI: 10.1016/S0040-6090(00)00896-8.

Partial International Search Report—PCT/US2016/013180—ISA/EPO—Apr. 20, 2016.

Seongjae C., et al., "Design Optimization of Tunneling Field-Effect Transistor Based on Silicon Nanowire PNPN Structure and its Radio Frequency Characteristics", Current Applied Physics, vol. 12, No. 3, Oct. 14, 2011 (Oct. 14, 2011), pp. 673-677, XP028898223, ISSN: 1567-1739, DOI: 10.1016/J.CAP.2011.10.003.

Tura A., et al., "Vertical Silicon p-n-p-n Tunnel nMOSFET With MBE-Grown Tunneling Junction", IEEE Transactions on Electron Devices, IEEE Service Center, Piscataway, NJ, US, vol. 58, No. 7, Jul. 1, 2011(Jul. 1, 2011), pp. 1907-1913, XP011367838, ISSN: 0018-9383, DOI: 10.1109/TED.2011.2148118.

Bhuwalka, Krishna K. et al., "Vertical Tunnel Field-Effect Transistor with Bandgap Modulation and Workfunction Engineering," Proceeding of the 34th European Solid-State Device Research conference (ESSDERC), 2004, pp. 241-244.

Hu, Chenming et al., "Green Transistor—A VDD Scaling Path for Future Low Power ICs," International Symposium on VLSI Technology, Systems and Applications, IEEE, 2008, pp. 14-15.

Hu, Chenming et al., "Prospect of Tunneling Green Transistor for 0.1V CMOS," International Electron Devices Meeting (IEDM), 2010, pp. 16.1.1-16.1.4.

Jhaveri, Ritesh et al., "Novel MOSFET Structures for RF Applications," 9th International Conference on Solid-State and Integrated-Circuit Technology (ICSICT), 2008, 4 pages.

Yuan, Jun, "Gate and Source/Drain Engineering for Nanoscale MOSFET," University of California, UMI Microform, 2005, 150 pages.

* cited by examiner

FABRICATION OF A TRANSISTOR INCLUDING A TUNNELING LAYER

I. FIELD

The present disclosure is generally related to a method of fabricating a transistor device.

II. DESCRIPTION OF RELATED ART

Advances in technology have resulted in smaller and more powerful computing devices. For example, a variety of portable personal computing devices including wireless telephones such as mobile and smart phones, tablets and laptop computers are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities. As computing devices, such as mobile phones, become smaller and more energy efficient, components (e.g., transistors) of the devices need to operate at reduced power levels.

III. SUMMARY

A tunnel transistor may have lower power consumption requirements (e.g., may activate at a lower threshold voltage) than a metal-oxide-semiconductor field-effect (MOSFET) transistor. Due to the low power consumption of the tunnel transistor, the tunnel transistor may be referred to as a "green" transistor. However, tunnel transistors, when activated, may allow less current to flow than is needed for a particular application. Lower amounts of current may not be suitable for all applications. Therefore, it is desirable to increase tunneling efficiency (i.e., to increase current flow) in tunnel transistors, so that the tunnel transistors may provide more power-efficient operation in electronic devices.

A tunnel transistor with increased tunneling efficiency includes a gate structure and a tunnel structure. The tunnel structure may include multiple layers including a channel layer between a source layer and a drain layer. A thin depleted tunneling layer (e.g., an N+ doped layer or a P+ doped layer) may be included between the source layer and the drain layer to increase tunneling efficiency of the tunnel transistor. The increased tunneling efficiency may be based in part on a thickness of the thin depleted tunneling layer. For example, tunneling efficiency through the tunneling layer may decrease as the thickness increases past a threshold thickness. The layers of the tunnel structure may be arranged so that the layers are formed one on top of the other (i.e., in a stack) with one of the source or the drain being at the bottom of the stack and the other being at the top of the stack. The channel layer and the tunneling layer may be positioned between the source layer and the drain layer. The stack may be coupled to a high-k dielectric layer. By forming the layers in a stack, the thickness of the tunneling layer may be more easily controlled. Thus, the tunneling efficiency of the tunnel transistor, which may be affected by the thickness of the tunneling layer, may be more easily controlled.

Various examples of a tunnel transistor are disclosed. For example, a tunnel transistor may include a vertical electron tunnel structure (e.g., a stacked structure) that includes a tunneling layer. The tunnel transistor may include a gate structure having a split-gate configuration. Use of a tunneling layer in a vertical electron tunnel structure enables a thickness of the tunneling layer to be more easily controlled as compared to a tunneling layer formed in a planar tunnel structure. Because tunneling efficiency may decrease when the tunneling layer is too thin or too thick, controlling the thickness of the tunneling layer may improve tunneling efficiency in the tunnel transistor. Accordingly, the disclosed tunnel transistor has increased tunneling efficiency as compared to planar tunnel transistors.

In a particular aspect, an apparatus includes an electron tunnel structure that includes a tunneling layer, a channel layer, a source layer, and a drain layer. The tunneling layer and the channel layer are positioned between the source layer and the drain layer. The transistor device further includes a high-k dielectric layer adjacent to the electron tunnel structure.

In another particular aspect, a method of forming a tunnel transistor device includes forming an electron tunnel structure that includes a tunneling layer, a channel layer, a source layer, and a drain layer. The tunneling layer and the channel layer are positioned between the source layer and the drain layer. The method further includes forming a high-k dielectric layer adjacent to the electron tunnel structure.

In another particular aspect, an apparatus includes means for electron tunneling that includes a tunneling layer, a channel layer, a source layer, and a drain layer. The tunneling layer and the channel layer are positioned between the source layer and the drain layer. The apparatus further includes means for insulating adjacent to the means for electron tunneling.

In another particular aspect, a computer readable device stores data for enabling fabrication equipment to form a transistor. The data, when used by the fabrication equipment, causes the fabrication equipment to initiate formation of an electron tunnel structure including a tunneling layer, a channel layer, a source layer, and a drain layer. The tunneling layer and the channel layer are positioned between the source layer and the drain layer. The data further causes the fabrication equipment to form a high-k dielectric layer adjacent to the electron tunnel structure.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Particular embodiments of the present disclosure are described below with reference to the drawings. In the description, common features are designated by common reference numbers throughout the drawings.

Figure 1:
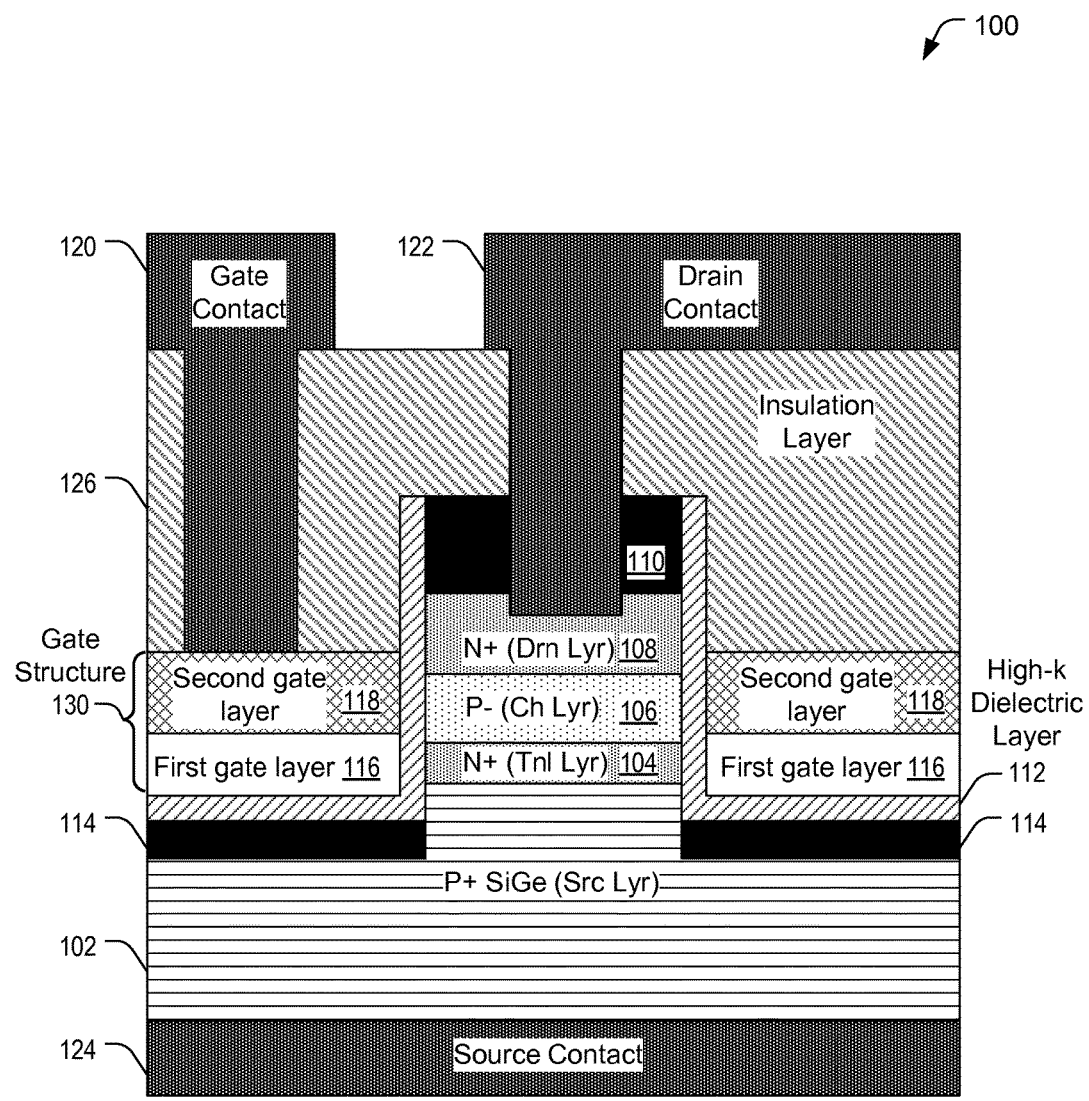
FIG. 1 is a block diagram of a particular example of a transistor.

Referring to FIG. 1, a particular illustrative embodiment of a transistor device is disclosed and generally designated 100. The transistor device 100 is an example of an N-type metal-oxide-semiconductor (NMOS) transistor.

The transistor device 100 includes a gate contact 120 and a drain contact 122. The gate contact 120 extends through a liner layer 126 (e.g., an insulation layer) and is coupled to a gate structure 130. The gate contact 120 may be configured to energize the gate structure 130 by providing a current/voltage. The liner layer 126 protects and insulates components of the transistor device 100. In a particular example, the liner layer 126 includes silicon dioxide ($SiO_2$), silicon nitride (SiN) or a combination thereof.

The drain contact 122 extends through the liner layer 126 and a first hard mask layer 110, and the drain contact 122 is coupled to a drain layer 108 of a vertical electron tunnel structure. The drain contact 122 may be configured to receive current flowing through the vertical electron tunnel structure and to carry the current out of the transistor device 100. The vertical electron tunnel structure includes the drain layer 108, a channel layer 106, a tunneling layer 104, and a source layer 102. In the illustrated example, the vertical electron tunnel structure is arranged so that the layers 102-108 are formed one on top of the other (i.e., stacked), as described with reference to FIG. 5. The source layer 102 may provide a source of electrons. The channel layer 106 may provide a channel for the electrons, and the drain layer 108 may receive the electrons. The tunneling layer 104 may enable more efficient electron tunneling through the vertical electron tunnel structure by narrowing a band gap associated with the vertical electron tunnel structure. A thickness of the tunneling layer 104 may affect efficiency of electron tunneling (e.g., affect the band gap). Forming (i.e., stacking) the layers 102-108 one on top of the other may enable more accurate control of layer thickness than if the layers 102-108 were formed side by side. Since the thickness of the tunneling layer 104 may affect the efficiency of electron tunneling, forming the layers 102-108 one on top of the other may enable more accurate control of the efficiency of electron tunneling.

The tunneling layer 104 may have a first doping type (e.g., N), and the source layer 102 and channel layer 106 may have a second doping type (e.g., P). As used herein, materials with different concentrations of P doping (e.g., P, P+, and P−) are considered to have the same doping "type." Similarly, materials with different concentrations of N doping (e.g., N, N+, N−) are considered to have the same doping "type." In the illustrated example, the source layer 102 is a P+ doped layer, the tunneling layer 104 is an N+ doped layer, the channel layer 106 is a P− doped layer, and the drain layer 108 is a N+ doped layer. One or more of the layers 102-108 may include silicon (Si) or silicon germanium (SiGe). In a particular example, P+ doped layers (e.g., the source layer 102) include SiGe. SiGe has a lower valance band (Ev) than silicon. Accordingly, a difference (Eg) between the valance band (Ev) of the source layer 102 and a conduction band (Ec) of a neighboring material (e.g., of the gate structure 130) may be lower when the source layer 102 includes SiGe rather than Si. The tunneling efficiency of the vertical electron tunnel structure may increase as the difference Eg decreases. Therefore, using SiGe in the source layer 102 may decrease Eg=Ev−Ec. Thus, using SiGe in the source layer 102 may increase tunneling efficiency in the transistor device 100.

The vertical electron tunnel structure is protected by the first hard mask layer 110 and by a second hard mask layer 114. The hard mask layers 110, 114 may protect the vertical electron tunnel structure layers 102-108 during fabrication and operation of the transistor device 100. For example, the hard mask layers 110, 114 may protect the vertical electron tunnel structure layers 102-108 from being etched during a subsequent etching process. In a particular example, the hard mask layers 110, 114 include $SiO_2$.

A dielectric layer 112 is positioned between the gate structure 130 and the vertical electron tunnel structure. The dielectric layer 112 may be a high-k dielectric layer. As used herein, "k" refers to a dielectric constant of a material. The dielectric layer 112 may have a high-k as compared to other materials (e.g., $SiO_2$). The high-k dielectric layer 112 may include a high-k dielectric material, such as a nitride based material (e.g., formed by infusing nitride into a $SiO_2$ layer), a hafnium based material, a zirconium based material, or a combination thereof. In the illustrated example, the gate structure 130 has a "split-gate" configuration. A split-gate configuration includes more than one layer, where work functions associated with the layers of the gate structure 130 are different from one another. For example, the gate structure 130 includes a first gate layer 116 (e.g., a conduction band or "Ec" layer) and a second gate layer 118 (e.g., a mid-gap layer). The layers 116, 118 may be made of different materials associated with different work functions. For example, the first gate layer 116 may include a first material associated with a first work function, and the second gate layer 118 may include a second material associated with a second work function. In particular examples, a value of the first work function is lower than a value of the second work function. In some examples, the first material includes aluminum, titanium, or a combination thereof. In some examples, the second material includes tungsten, titanium nitride, or a combination thereof. The second gate layer 118 is positioned on top of the first gate layer 116, and both gate layers 116, 118 are in contact with the side wall of the dielectric layer 112. The gate structure 130 is separated from the vertical electron tunnel structure by the dielectric layer 112. In the illustrated example, the first gate layer 116 is in contact with a portion of the dielectric layer 112 corresponding to (e.g., adjacent to) the tunneling layer 104.

The transistor device 100 further includes a source contact 124 coupled to the source layer 102 of the vertical electron tunnel structure. The source contact 124 may be configured to provide current to the vertical electron tunnel structure. It should be noted that different configurations of the layers 102-108 and the contacts 120-124 are possible. For example, a sequence of the layers 102-108 may be reversed and the contacts 120-124 may be rearranged accordingly. In alternative configurations, the gate structure 130 may be positioned so that the first gate layer 116 is in contact with a portion of the dielectric layer 112 corresponding to (e.g., adjacent to) the tunneling layer 104.

In operation, when the gate contact 120 receives a voltage/current, the gate structure 130 may be energized and may allow current to flow from the source contact 124 through the vertical electron tunnel structure to the drain contact 122. An amount of current that flows through the vertical electron tunnel structure may be based on work function differences between materials of the gate structure 130 and the layers 102-108 of the vertical electron tunnel structure. By using gate layers (e.g., the first gate layer 116 and the second gate layer 118) with different work functions, differences (band gaps) between work functions of the gate structure 130 and work functions of the vertical electron tunnel structure may be controlled for specific portions of the vertical electron tunnel structure. For example, work function of the layers 102-108 may vary. Accordingly, a gate structure having a single work function may have varied band gaps with the vertical electron tunnel structure. The first gate layer 116 having a relatively lower work function than the second gate layer 118 may enable more efficient electron tunneling through the tunneling layer 104 because the first gate layer 116 may have a lower band gap with the tunneling layer 104 than the second gate layer 118 would have.

As explained above, including the tunneling layer 104 in the transistor device 100 and using SiGe in the source layer 102 may increase tunneling efficiency (i.e., increase current flow when the transistor device 100 is activated) through the vertical electron tunnel structure. Thus, the transistor device 100 may enable more efficient electron tunneling than other tunnel transistors by including a vertical electron tunnel structure with a tunneling layer, including SiGe in a source layer, including a split-gate structure, or a combination thereof. An illustrative example of fabricating the transistor device 100 of FIG. 1 is further described with reference to FIGS. 5A-5L.

Figure 2:
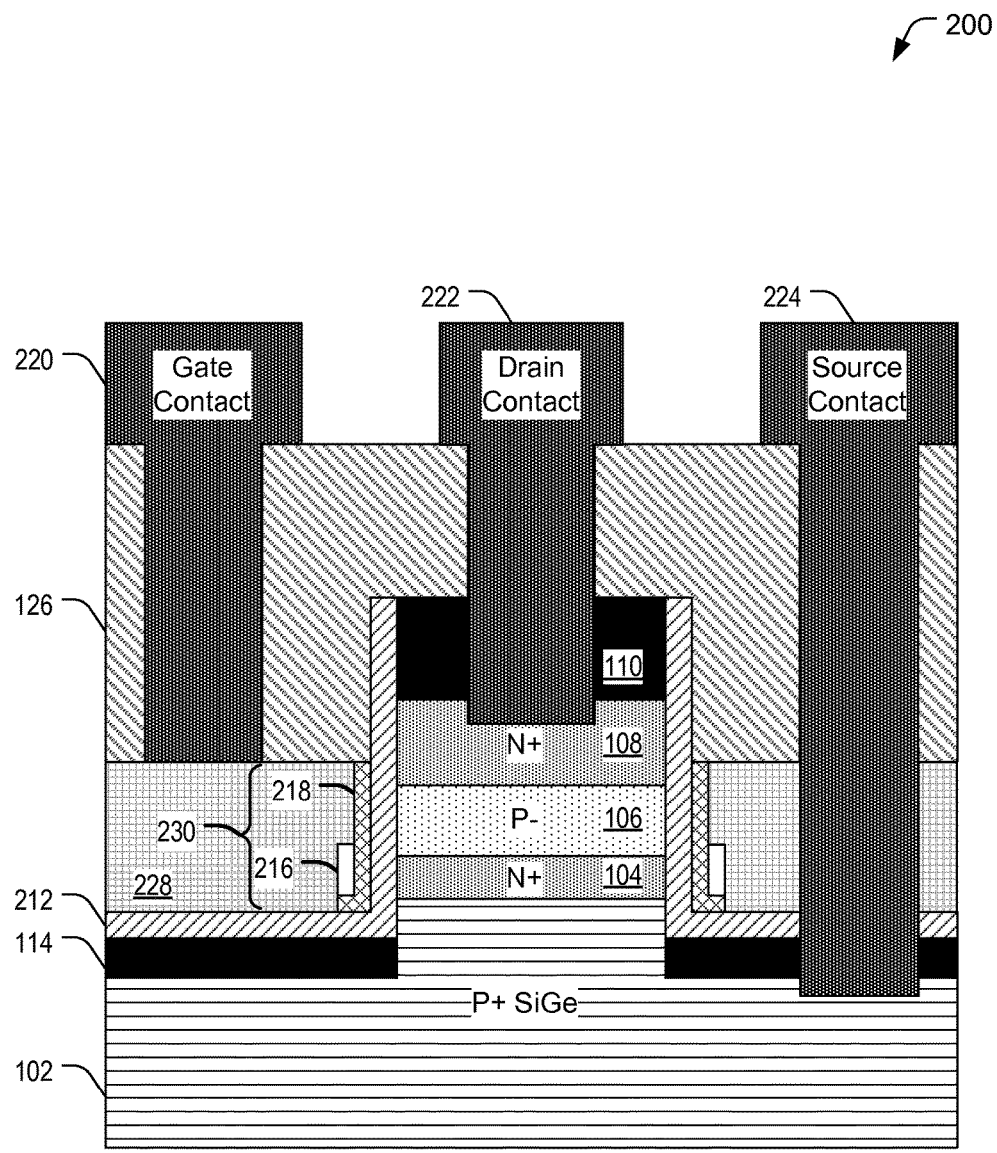
FIG. 2 is a block diagram of another particular example of a transistor.

Referring to FIG. 2, another example of a transistor device is shown and designated 200. The transistor device 200 is a second example of an NMOS transistor. The transistor device 200 includes a gate contact 220, a drain contact 222, and a source contact 224. The transistor device 200 includes a metal layer 228 and a gate structure 230. The transistor device 200 further includes the vertical electron tunnel structure of the transistor device 100, including the source layer 102, the tunneling layer 104, the channel layer 106, and the drain layer 108. The transistor device 200 further includes the first hard mask layer 110, the second hard mask layer 114, and the liner layer 126 of the transistor device 100.

The gate contact 220 extends through the liner layer 126 and is coupled to the metal layer 228. The metal layer 228 is coupled to the gate structure 230. The gate contact 220 may be configured to energize the gate structure 230 by providing a current/voltage to the metal layer 228, which may apply the current/voltage to the gate structure 230.

The drain contact 222 extends through the liner layer 126 and the first hard mask layer 110, and is coupled to the drain layer 108 of the vertical electron tunnel structure. The drain contact 222 may be configured to receive current flowing through the vertical electron tunnel structure and to carry the current out of the transistor device 200.

The source contact 224 may be connected to the source layer 102. While shown passing through or over the metal layer 228, the source contact 224 may be manufactured (e.g., fabricated) so that the source contact 224 does not energize the gate layers 216, 218. For example, the source contact 224 may be insulated at a location where the source contact 224 passes through the metal layer 228. Alternatively, the source contact 224 may not pass through (e.g., may be located in front of, behind, or to the side of) the metal layer 228. The source contact 224 may be configured to provide current/voltage to the source layer 102.

The transistor device 200 includes a dielectric layer 212 positioned between the gate structure 130 and the vertical electron tunnel structure. The dielectric layer 212 may correspond to the dielectric layer 112 of the transistor device 100. In the illustrated example, the gate structure 230 has a "split-gate" configuration different from the split-gate configuration of the gate structure 130. The gate structure 230 includes a first gate layer 216 and a second gate layer 218.

The first gate layer 216 may correspond to (e.g., have the same properties as) the first gate layer 116, and the second gate layer 218 may correspond to (e.g., have the same properties as) the second gate layer 118 of the transistor device 100, but the split-gate layers 216, 218 are arranged differently than the split-gate layers 116, 118. As shown in FIG. 2, the first gate layer 216 is formed along a first sidewall of the second gate layer 218, and a second sidewall of the second gate layer 218 is formed along a side wall of the dielectric layer 212. The second gate layer 218 is positioned between the dielectric layer 212 and the first gate layer 216.

Thus, FIG. 2 illustrates another example of a transistor device that may include a tunnel transistor that includes a tunneling layer, a SiGe layer, and a gate structure with a split-gate configuration. Therefore, the transistor device 200 may enable more efficient electron tunneling. An illustrative example of fabricating the transistor device 200 of FIG. 2 is further described with reference to FIGS. 6A-6H.

Figure 3:
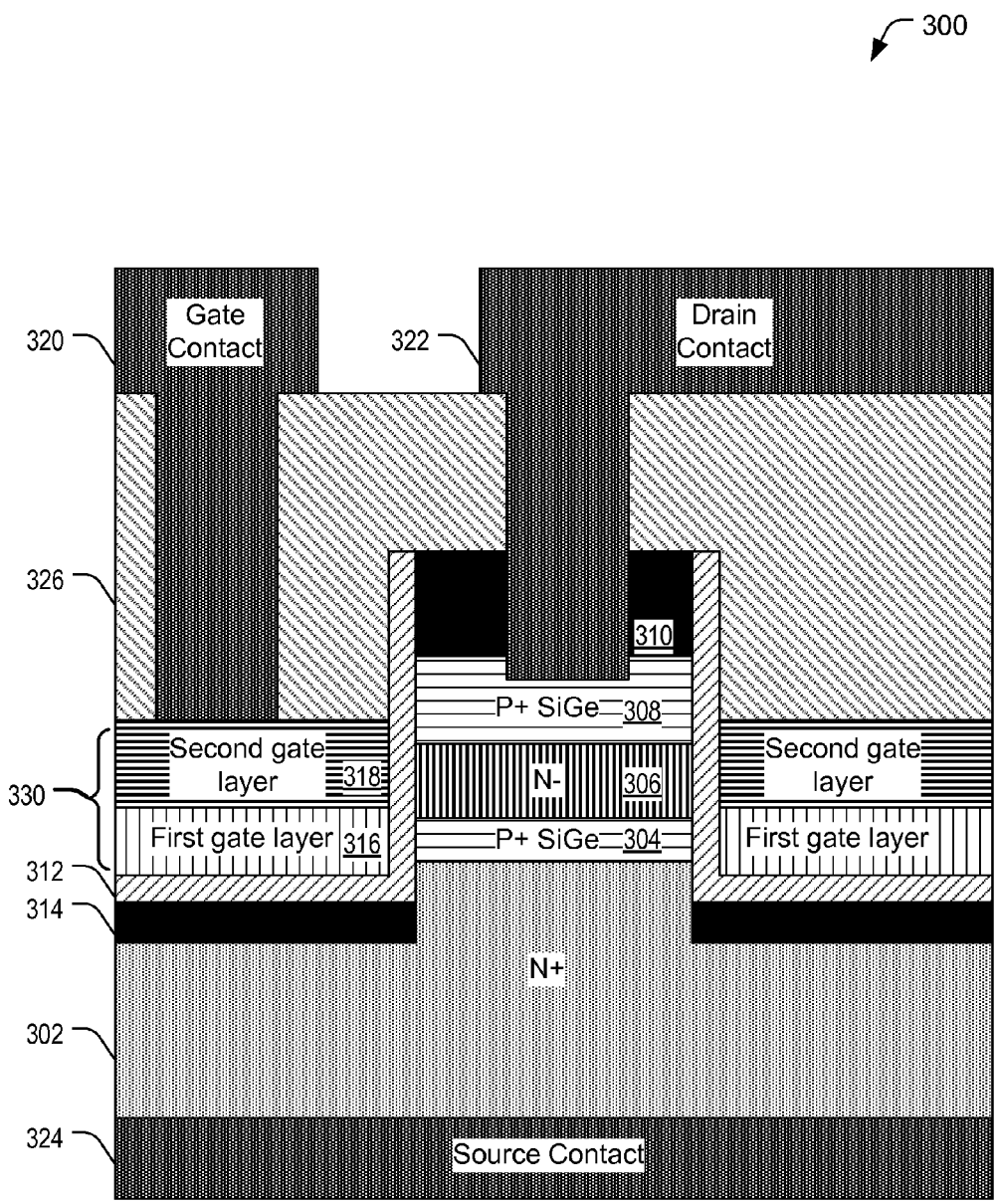
FIG. 3 is a block diagram of another particular example of a transistor.

Referring to FIG. 3, a particular illustrative embodiment of a transistor device is disclosed and generally designated 300. The transistor device 300 is an example of a P-type metal-oxide-semiconductor (PMOS) transistor.

The transistor device 300 includes a gate contact 320 and a drain contact 322. The gate contact 320 extends through a liner layer 326 (e.g., an insulation layer) and is coupled to a gate structure 330. The gate contact 320 may be configured to energize the gate structure 330 by providing a current/voltage. The liner layer 326 protects and insulates components of the transistor device 300. In particular examples, the liner layer 326 includes silicon dioxide ($SiO_2$), silicon nitride (SiN), or a combination thereof.

The drain contact 322 extends through the liner layer 326 and a first hard mask layer 310 and is coupled to a drain layer 308 of a vertical electron tunnel structure. The vertical electron tunnel structure includes the drain layer 308, a channel layer 306, a tunneling layer 304, and a source layer 302. In the illustrated example, the vertical electron tunnel structure is arranged so that the layers 302-308 are formed one on top of the other, as further described with reference to FIG. 7. The source layer 302 may provide a source of electron holes. The channel layer 306 may provide a channel for the electron holes, and the drain layer 308 may receive the electron holes. The tunneling layer 304 may enable more efficient electron tunneling (e.g., more efficient tunneling of the electron holes) through the vertical electron tunnel structure by narrowing a band gap associated with the vertical electron tunnel structure. The drain contact 322 may be configured to receive current flowing through the vertical electron tunnel structure and to carry the current out of the transistor device 300.

The tunneling layer 304 may have a first doping type (e.g., P) and the source layer 302 and channel layer 306 may have a second doping type (e.g., N). In the illustrated example, the source layer 302 is a N+ doped layer, the tunneling layer 304 is an P+ doped layer, the channel layer 306 is a N− doped layer, and the drain layer 308 is a P+ doped layer. One or more of the layers 302-308 may include silicon or silicon germanium (SiGe). In a particular example, P+ doped layers (e.g., the tunneling layer 304 and the drain layer 308) include SiGe. SiGe has a lower valance band (Ev) than silicon. Accordingly, a difference (Eg) between the valance band and a conduction band (Ec) associated with a neighboring material (e.g., material of the gate structure 330) may be lowered by using SiGe. The tunneling efficiency of the vertical electron tunnel structure may increase as Eg decreases. Thus, the use of SiGe may increase tunneling efficiency in the transistor device 300.

The vertical electron tunnel structure is protected by the first hard mask layer 310 and by a second hard mask layer 314. The hard mask layers 310, 314 may protect the vertical electron tunnel structure layers 302-308 during fabrication and operation of the transistor device 300. In a particular example, the hard mask layers 310, 314 include $SiO_2$.

A dielectric layer 312 is positioned between the gate structure 330 and the vertical electron tunnel structure. The dielectric layer 312 may be a high-k dielectric layer, such as the high-k dielectric layer 112. In the illustrated example, the gate structure 330 has a "split-gate" configuration. A split-gate configuration includes more than one layer, where work functions associated with the layers in the split-gate configuration are different from one another. For example, the gate structure 330 includes a first gate layer 316 (e.g., a valance band or "Ev" layer) and a second gate layer 318 (e.g., a mid-gap layer). The first gate layer 316 may include a first material associated with a first work function, and the second gate layer 318 may include a second material associated with a second work function. In particular examples, a value of the first work function is higher than a value of the second work function. In an example, the first material includes titanium nitride. In an example, the second material includes tungsten, titanium nitride, or a combination thereof. In a particular example, both the first gate layer 316 and the second gate layer 318 include titanium nitride. In this example, a difference between the first work function and the second work function may be based on a difference between concentrations of nitrogen in the first gate layer 316 and the second gate layer 318. The second gate layer 318 is positioned on top of the first gate layer 316, and both gate layers 316, 318 are in contact with the side wall of the dielectric layer 312. The gate structure 330 is separated from the vertical electron tunnel structure by the dielectric layer 312. In the illustrated example, the first gate layer 316 is in contact with a portion of the dielectric layer 312 corresponding to (e.g., adjacent to) the tunneling layer 304.

The transistor device 300 further includes a source contact 324 coupled to the source layer 302 of the vertical electron tunnel structure. The source contact 324 may be configured to provide current to the vertical electron tunnel structure. It should be noted that different configurations of the layers 302-308 and the contacts 320-324 may be used in alternative embodiments. For example, a sequence of the layers 302-308 may be reversed and the contacts 320-324 may be rearranged accordingly.

In operation, when the gate contact 320 receives a voltage/current, the gate structure 330 may be energized and may allow current to flow from the source contact 324 through the vertical electron tunnel structure to the drain contact 322. An amount of current that flows through the vertical electron tunnel structure may be based on work function differences between materials of the gate structure 330 and the layers 302-308 of the vertical electron tunnel structure. By using gate layers (e.g., the first gate layer 316 and the second gate layer 318) with different work functions, differences (band gaps) between work functions of the gate structure 330 and work functions of the vertical electron tunnel structure may be controlled for specific portions of the vertical electron tunnel structure. For example, work functions of the layers 302-308 may vary. Accordingly, a gate structure having a single work function may have varied band gaps with the vertical electron tunnel structure. The first gate layer 316 having a relatively higher work function than the second gate layer 318 may enable more efficient electron tunneling through the tunneling layer 304 by having a lower band gap with the tunneling layer 304 than the second gate layer 318 would have.

As explained above, including the tunneling layer 304 and using SiGe in the tunneling layer 304 and the drain layer 308 may increase tunneling efficiency (i.e., increase current flow) through the vertical electron tunnel structure. Using a vertical electron tunnel structure may enable more efficient control of a thickness of the tunneling layer 304. Thus, the transistor device 300 may enable more efficient electron tunneling than other tunnel transistors by including a vertical electron tunnel structure with a tunneling layer 304, including SiGe in the tunneling layer 304 and/or the drain layer 308, including a gate structure with a split-gate structure, or a combination thereof. An illustrative example of fabricating the transistor device 300 of FIG. 3 is further described with reference to FIGS. 5A-5L.

Figure 4:
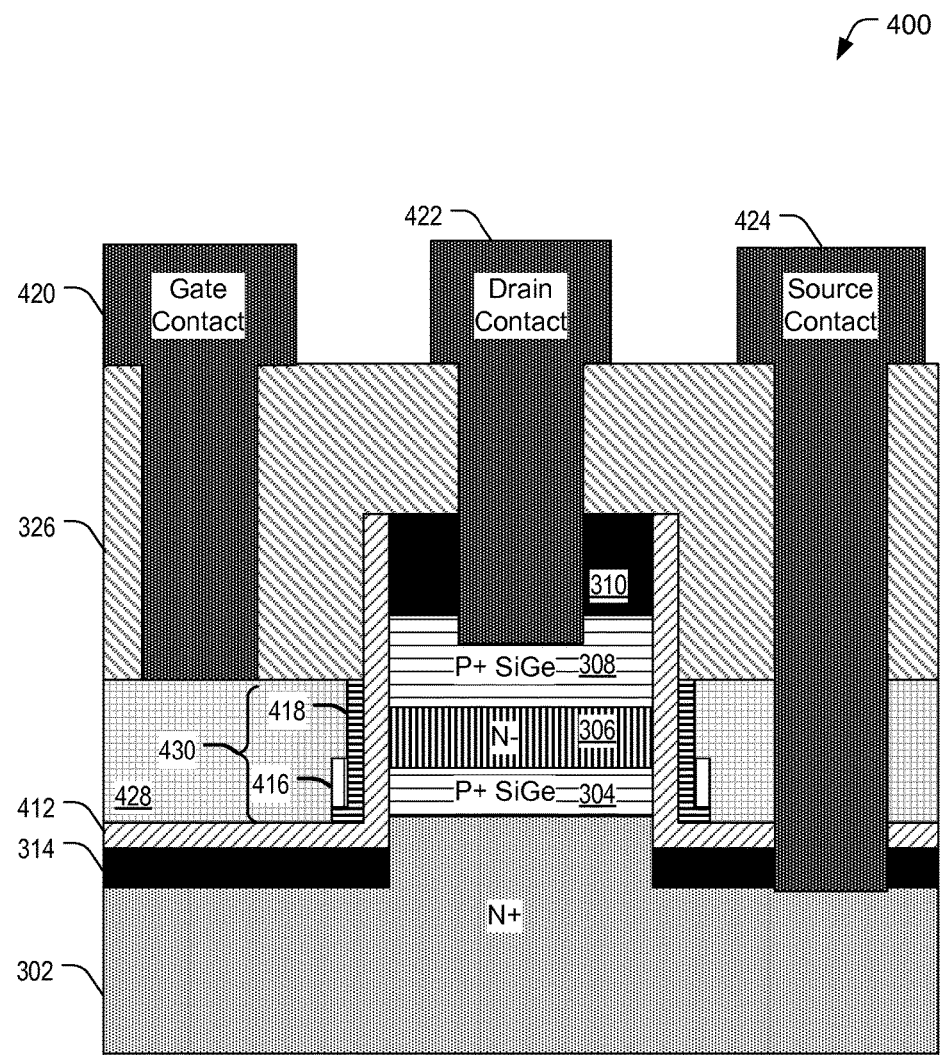
FIG. 4 is a block diagram of another particular example of a transistor.

Referring to FIG. 4, another example of a transistor device is shown and designated 400. The transistor device 400 is a second example of a PMOS transistor. The transistor device 400 includes a gate contact 420, a drain contact 422, and a source contact 424. The transistor device 400 includes a metal layer 428 and a gate structure 430. The transistor device 400 further includes the vertical electron tunnel structure of the transistor device 300, including the source layer 302, the tunneling layer 304, the channel layer 306, and the drain layer 308. The transistor device 400 further includes the first hard mask layer 310, the second hard mask layer 314, and the liner layer 326 of the transistor device 300.

The gate contact 420 extends through the liner layer 326 and is coupled to the metal layer 428. The metal layer 428 is coupled to the gate structure 430. The gate contact 420 may be configured to energize the gate structure 430 by providing a current/voltage to the metal layer 428, which may apply the current/voltage to the gate structure 430.

The drain contact 422 extends through the liner layer 326 and the first hard mask layer 310 and is coupled to the drain layer 308 of the vertical electron tunnel structure. The drain contact 422 may be configured to receive current flowing through the vertical electron tunnel structure and carry the current out of the transistor device 400.

The source contact 424 may be connected to the source layer 302. While shown passing through or over the metal layer 428, the source contact 424 may be manufactured (e.g., fabricated) so that the source contact 424 does not energize the gate structure 430. For example, the source contact 424 may be insulated at a location where the source contact 424 passes through the metal layer 428. Alternatively, the source contact 424 may not pass through (e.g., may be located in front of, behind, or to the side of) the metal layer 428. The source contact 424 may be configured to provide current/voltage to the source layer 302.

The transistor device 400 includes a dielectric layer 412 positioned between the gate structure 430 and the vertical electron tunnel structure. The dielectric layer 412 may correspond to the dielectric layer 312 of the transistor device 300. In the illustrated example, the gate structure 430 has a "split-gate" configuration different from the split-gate configuration of the gate structure 330 and similar to the split-gate configuration of FIG. 2. The first gate layer 416 may correspond to (e.g., have the same properties as) the first gate layer 316 and the second gate layer 418 may correspond to (e.g., have the same properties as) the second gate layer 318 of the transistor device 300, but the split-gate layers 416, 418 are arranged differently than the split-gate layers 316, 318. As shown in FIG. 4, the first gate layer 416 is formed along a first sidewall of the second gate layer 418, and a second sidewall of the second gate layer 418 is formed along a side wall of the dielectric layer 412. The second gate layer 418 is positioned between the dielectric layer 412 and the first gate layer 416.

Thus, FIG. 4 illustrates another example of a transistor device that may include a vertical electron tunnel structure, a SiGe layer, and a gate structure with a split-gate configuration. Therefore, the transistor device 400 may enable more efficient electron tunneling. An illustrative example of fabricating the transistor device 400 of FIG. 4 is further described with reference to FIGS. 6A-6H.

FIGS. 5A-5L illustrate examples of stages of a first fabrication process. The first fabrication process may be used to fabricate an NMOS transistor or a PMOS transistor. In FIGS. 5A-5L, stages of fabricating an NMOS transistor are shown on the left and corresponding stages of fabricating a PMOS transistor are shown on the right. In an illustrative embodiment, the NMOS transistor fabricated using the fabrication process shown on the left side of FIGS. 5A-5L may correspond to the transistor device 100 of FIG. 1, and the PMOS transistor fabricated using the fabrication process shown on the right side of FIGS. 5A-5L may correspond to the transistor device 300 of FIG. 3.

Figure 5A:
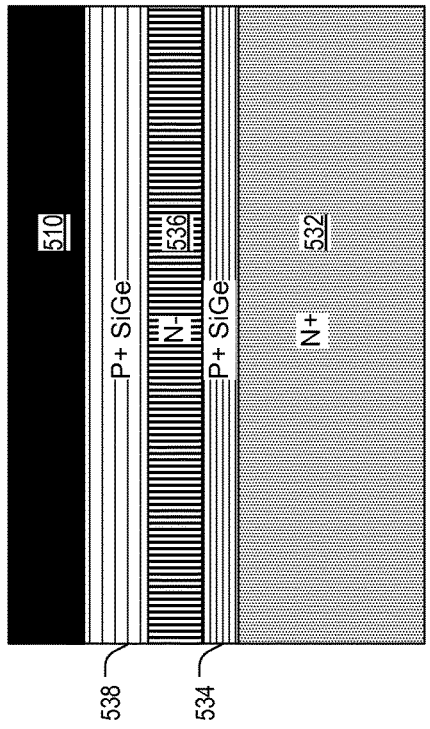
FIG. 5A is a diagram of a first stage of an illustrative example of a process of fabricating the transistor of FIG. 1 or FIG. 3.
Figure 5A:
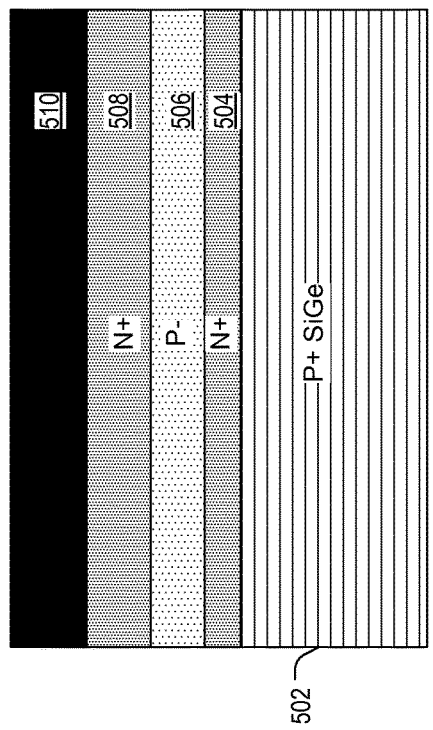

Referring to FIG. 5A, a first stage of the first fabrication process is depicted and generally designated 551. As shown in FIG. 5A, a vertical electron tunnel structure including a source layer 502, a tunneling layer 504, a channel layer 506, and a drain layer 508 may be formed when fabricating the NMOS transistor. When fabricating the PMOS transistor, a vertical electron tunnel structure including a source layer 532, a tunneling layer 534, a channel layer 536, and a drain layer 538 may be formed. When fabricating the NMOS transistor or the PMOS transistor, a first hard mask layer 510 may be deposited on top of the vertical electron tunnel structure layers 502-508. The vertical electron tunnel structure layers 502-508 may correspond to the vertical electron tunnel structure layers 102-108. Similarly, the vertical electron tunnel structure layers 532-538 may correspond to the vertical electron tunnel structure layers 302-308. The first hard mask layer 510 may correspond to the first hard mask layer 110 or to the first hard mask layer 310.

The vertical electron tunnel structure layers 502-508 (or 532-538) may be formed via epitaxial growth with in-situ doping. In particular examples, the source layer 502 (or 532) is formed, the tunneling layer 504 (or 534) is formed on top of the source layer 502 (or 532), the channel layer 506 (or 536) is formed on top of the tunneling layer 504 (or 534), and the drain layer 508 (or 538) is formed on top of the channel layer 506 (or 536). Thus, the tunneling layer 504 (or 534) and the channel layer 506 (or 536) may be positioned between the source layer 502 (or 532) and the drain layer 508 (538).

After the electron tunnel structure layers 502-508 (or 532-538) are formed, the first hard mask layer 510 may be deposited on top of the drain layer 508 (or 538). Forming the layers 502-508 (or 532-538) one on top of the other (e.g., via epitaxial growth) may enable more accurate control of a thickness of the tunneling layer 504 (or 534) than if the layers 502-508 (or 532-538) were formed side by side (e.g., in a planar configuration).

Figure 5B:
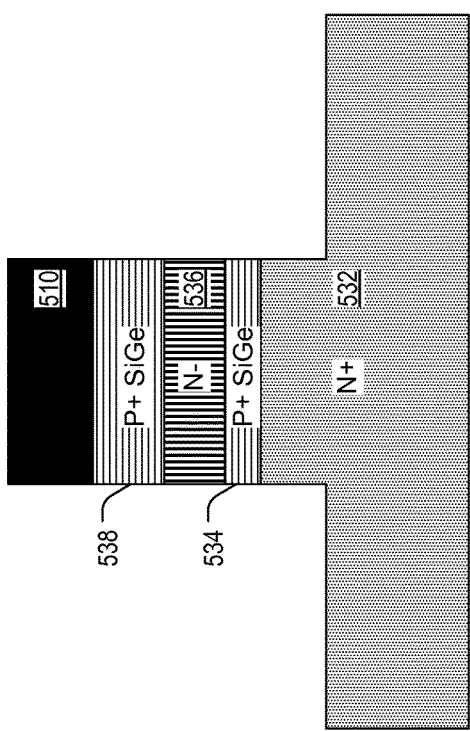
FIG. 5B is a diagram of a second stage of the illustrative example of a process of fabricating the transistor of FIG. 1 or FIG. 3.
Figure 5B:
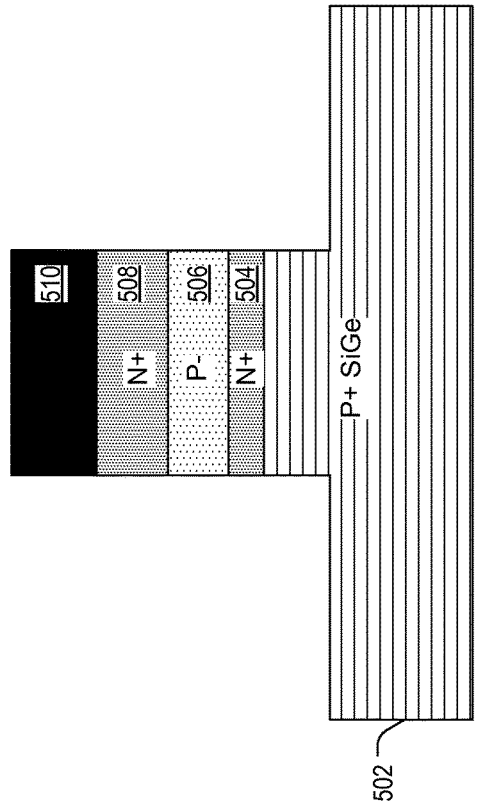

Referring to FIG. 5B, a second stage of the first fabrication process is depicted and generally designated 552. In FIG. 5B, the vertical electron tunnel structure layers 502-508 (or 532-538) and the first hard mask layer 510 of the transistor device are shown after having been shaped. For example, the vertical electron tunnel structure layers 502-

508 (or 532-538) and the first hard mask layer 510 may be shaped via reactive ion etching. For example, the reactive ion etching may be used to remove portions of the vertical electron tunnel structure layers 502-508 (or 532-538) and portions of the first hard mask layer 510.

Figure 5C:
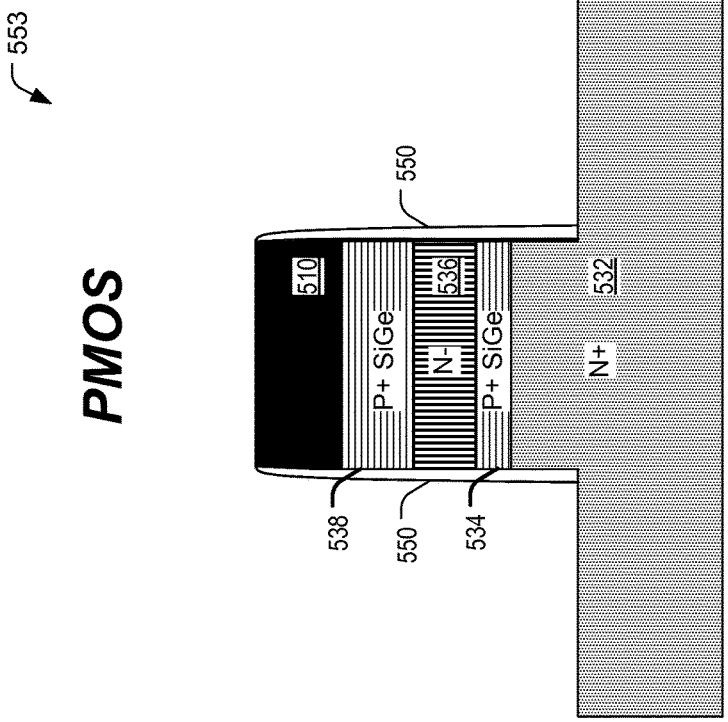
FIG. 5C is a diagram of a third stage of the illustrative example of a process of fabricating the transistor of FIG. 1 or FIG. 3.
Figure 5C:
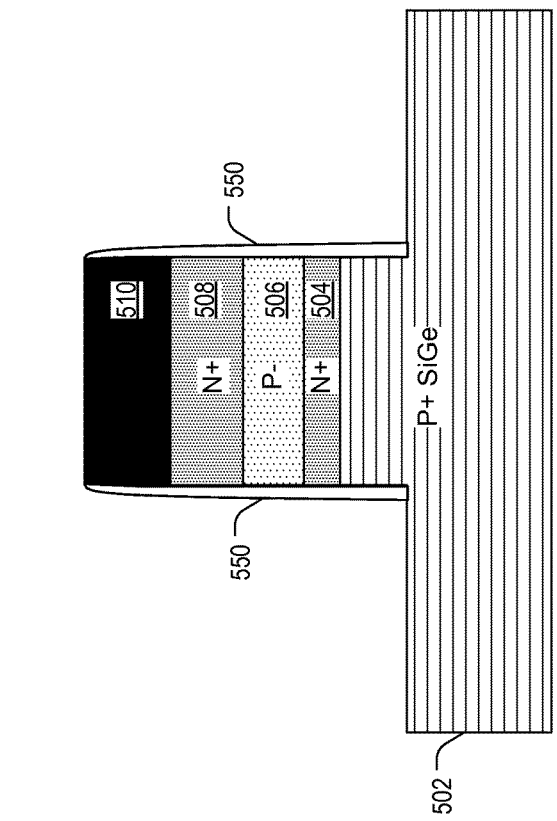

Referring to FIG. 5C, a third stage of the first fabrication process is depicted and generally designated 553. FIG. 5C shows spacers 550 may be formed (e.g., via deposition and etching) along the sides of the vertical electron tunnel structure layers 502-508 (or 532-538) and the first hard mask layer 510. In a particular example, the spacers 550 include silicon nitride.

Figure 5D:
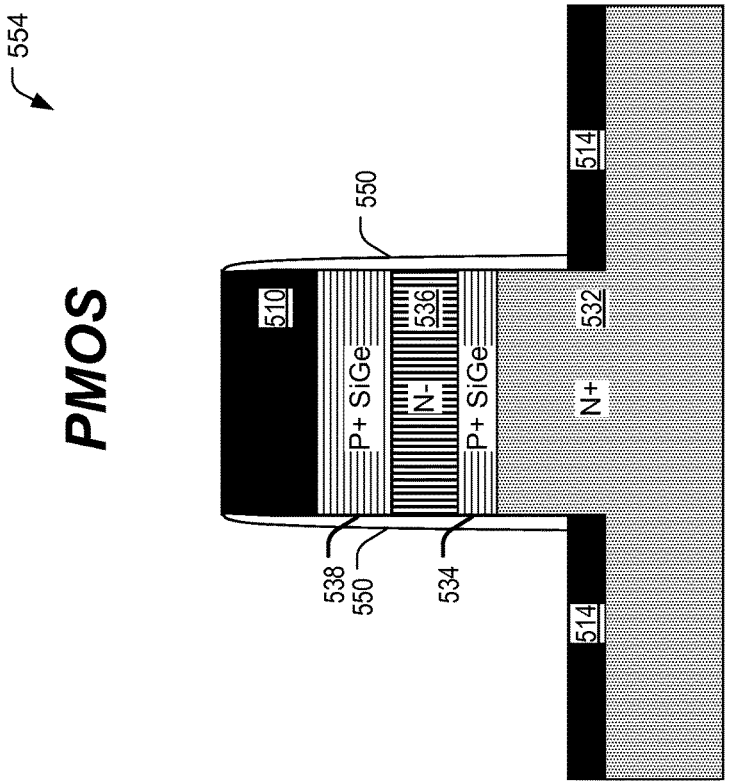
FIG. 5D is a diagram of a fourth stage of the illustrative example of a process of fabricating the transistor of FIG. 1 or FIG. 3.
Figure 5D:
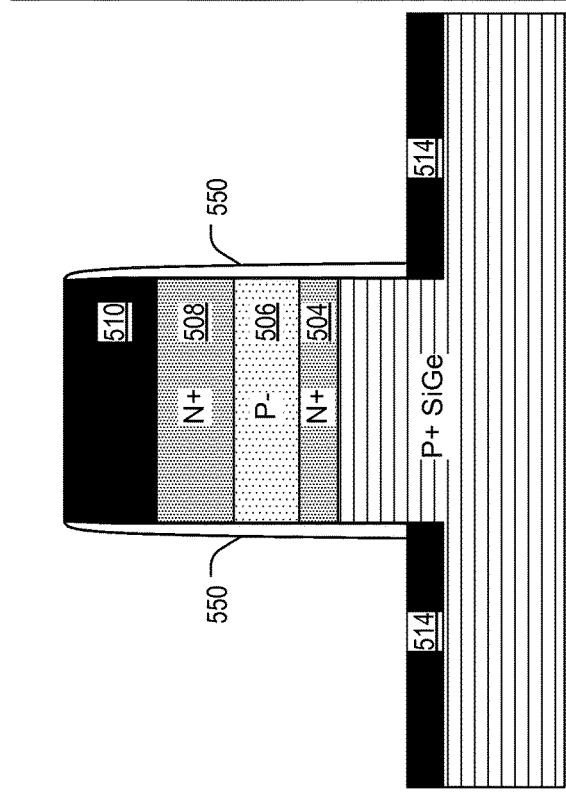

Referring to FIG. 5D, a fourth stage of the first fabrication process is depicted and generally designated 554. FIG. 5D illustrates a second hard mask layer 514. In the NMOS transistor, the second hard mask layer 514 may correspond to the second hard mask layer 114. In the PMOS transistor, the second hard mask layer 514 may correspond to the second hard mask layer 314. The second hard mask layer 514 may be formed via a thermal oxidation process. For example, portions of the source layer 502 (or 532) may be exposed to high temperature, resulting in the formation of silicon dioxide. The spacers 550 and the first hard mask layer 510 may protect the vertical electron tunnel structure layers 502-508 (or 532-538) during the thermal oxidation process.

Figure 5E:
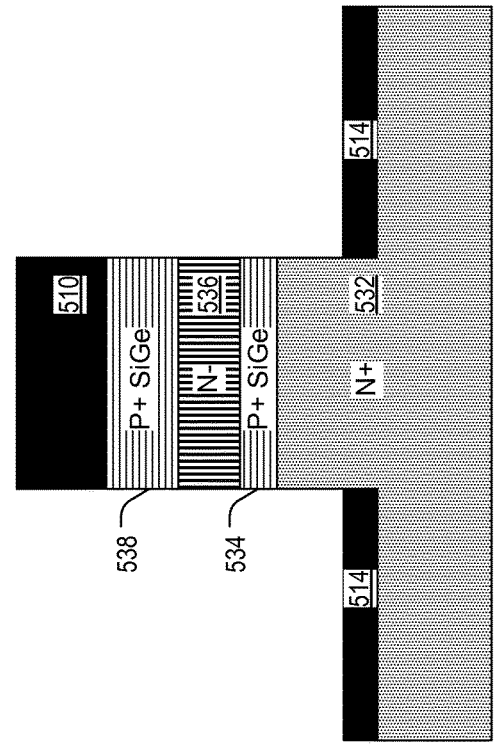
FIG. 5E is a diagram of a fifth stage of the illustrative example of a process of fabricating the transistor of FIG. 1 or FIG. 3.
Figure 5E:
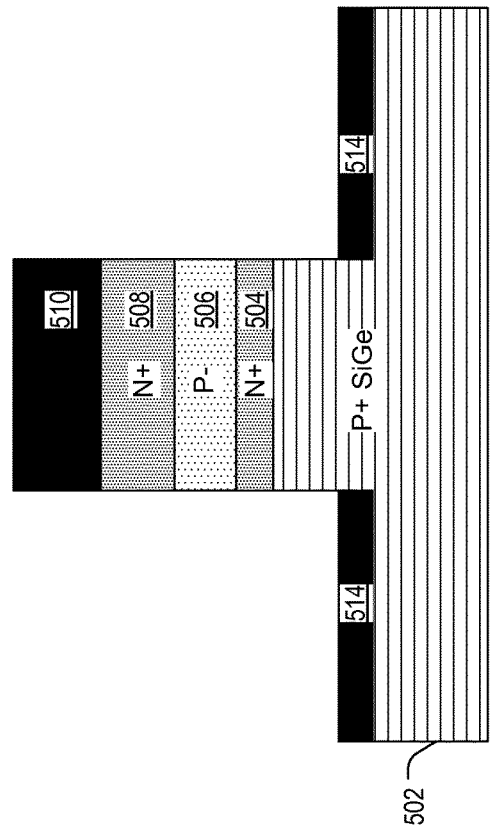

Referring to FIG. 5E, a fifth stage of the first fabrication process is depicted and generally designated 555. FIG. 5E shows the vertical electron tunnel structure layers 502-508 (or 532-538), the first hard mask layer 510, and the second hard mask layer 514 after removal of the spacers 550 (e.g., via chemical etching).

Figure 5F:
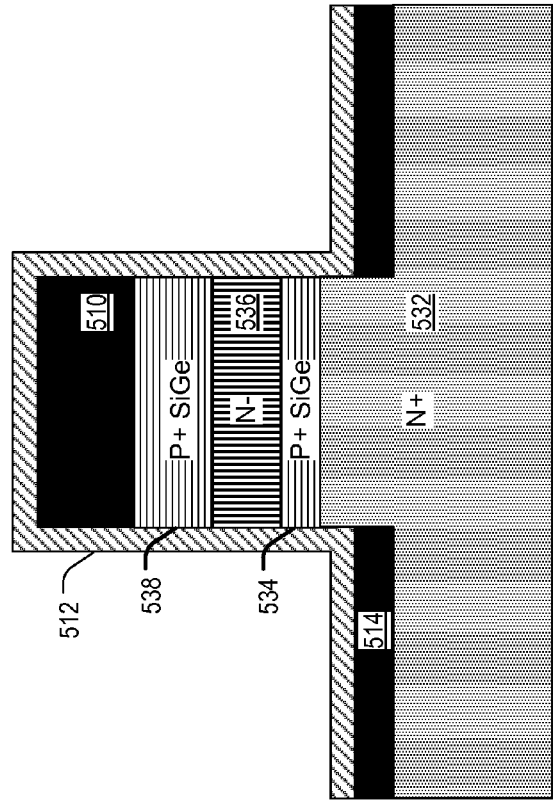
FIG. 5F is a diagram of a sixth stage of the illustrative example of a process of fabricating the transistor of FIG. 1 or FIG. 3.
Figure 5F:
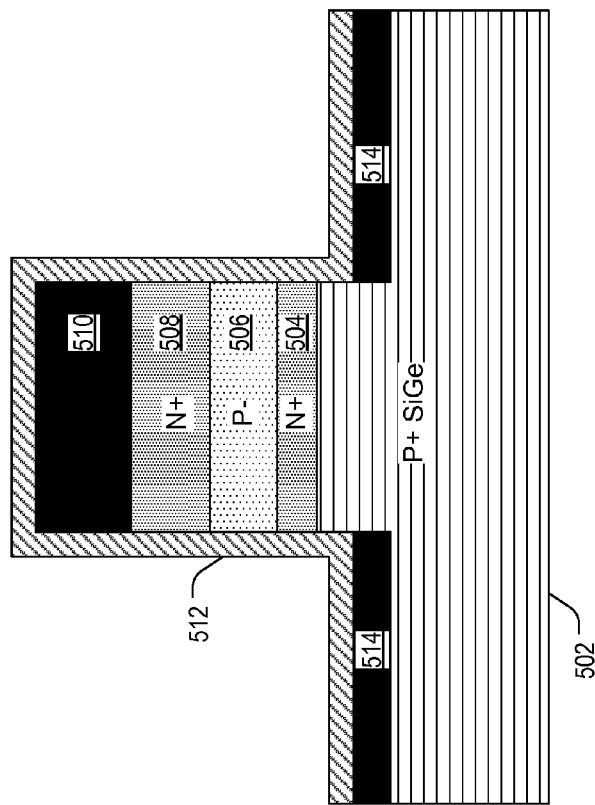

Referring to FIG. 5F, a transistor device during a sixth stage of the first fabrication process is depicted and generally designated 556. FIG. 5F illustrates a dielectric layer 512. In the NMOS transistor, the dielectric layer 512 may correspond to the dielectric layer 112. In the PMOS transistor, the dielectric layer 512 may correspond to the dielectric layer 312. The dielectric layer 512 is deposited on the first hard mask layer 510, on the second hard mask layer 514, and along sidewalls of the vertical electron tunnel structure layers 502-508 (or 532-538).

Figure 5G:
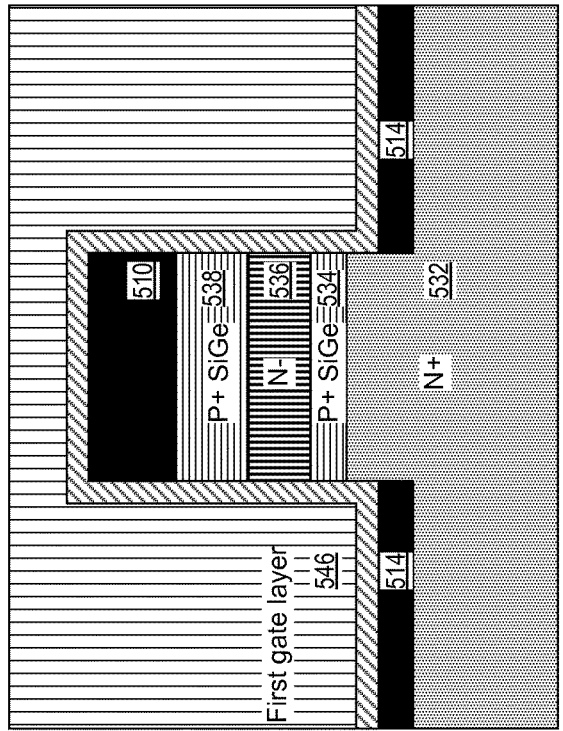
FIG. 5G is a diagram of an seventh stage of the illustrative example of a process of fabricating the transistor of FIG. 1 or FIG. 3.
Figure 5G:
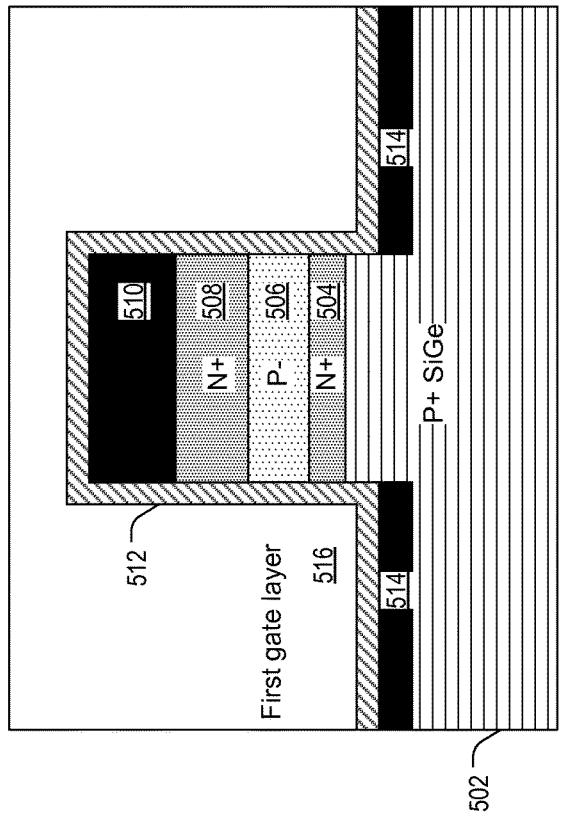

Referring to FIG. 5G, a seventh stage of the first fabrication process is depicted and generally designated 557. FIG. 5G illustrates a first gate layer 516 (e.g., an "Ec" layer) in the NMOS device. The first gate layer 516 may correspond to the first gate layer 116. The first gate layer 516 may include aluminum, titanium, or a combination thereof. The first gate layer 516 may be deposited on the dielectric layer 512 of the NMOS transistor. FIG. 5G further illustrates a first gate layer 546 (e.g., an "Ev" layer) in the PMOS device. The first gate layer 546 may correspond to the first gate layer 316. The first gate layer 546 may include titanium nitride. The first gate layer 546 may be deposited (e.g., via physical vapor deposition, chemical vapor deposition, electrochemical deposition, molecular beam epitaxy, atomic layer deposition, etc.) on the dielectric layer 512 of the PMOS transistor.

Figure 5H:
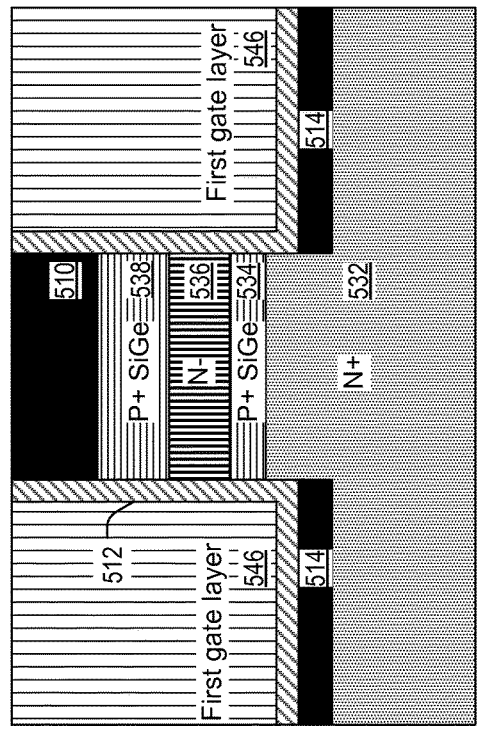
FIG. 5H is a diagram of a eighth stage of the illustrative example of a process of fabricating the transistor of FIG. 1 or FIG. 3.
Figure 5H:
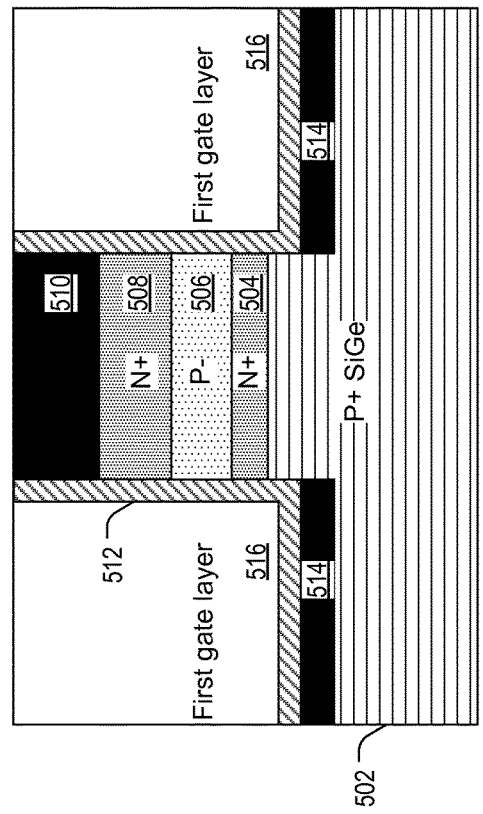

Referring to FIG. 5H, an eighth stage of the first fabrication process is depicted and generally designated 558. FIG. 5H shows the transistor after removal (e.g., via chemical-mechanical planarization) of a portion of the first gate layer 516 (or 546) extending above a portion of the first hard mask layer 510. In addition, a portion of the dielectric layer 512 extending above the portion of the first hard mask layer 510 may be removed (e.g., via chemical-mechanical planarization), as shown.

Figure 5I:
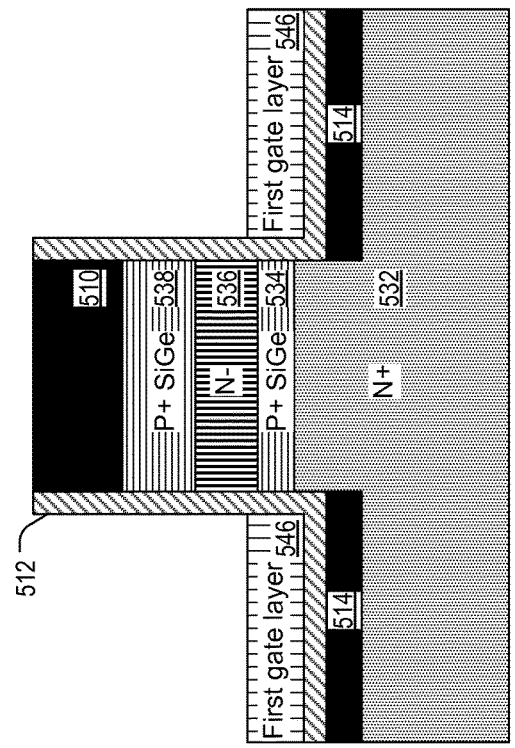
FIG. 5I is a diagram of a ninth stage of the illustrative example of a process of fabricating the transistor of FIG. 1 or FIG. 3.
Figure 5I:
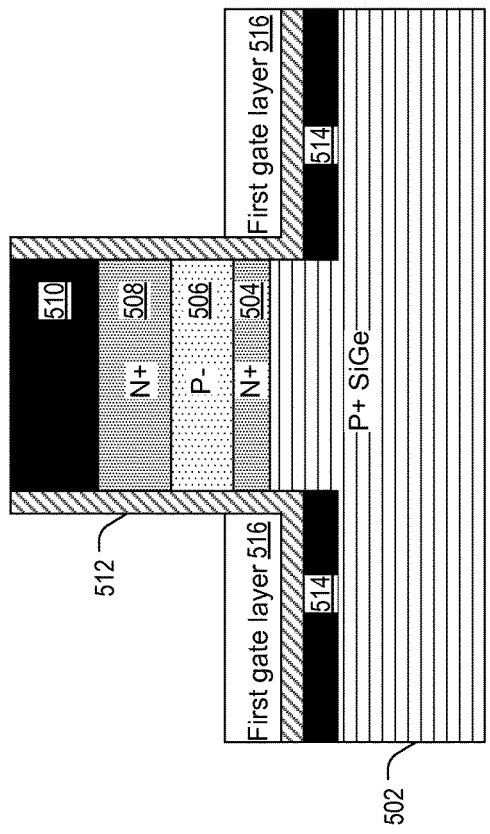

Referring to FIG. 5I, a ninth stage of the first fabrication process is depicted and generally designated 559. FIG. 5I shows the transistor device after removal of additional portions of the first gate layer 516 (or 546). For example, additional portions of the first gate layer 516 may be removed (e.g., via reactive ion etching) so that the first gate layer 516 (or 546) is adjacent to portions of the dielectric layer 512 corresponding to (e.g., adjacent to) the source layer 502 (or 532), the tunneling layer 504 (or 534), and the channel layer 506 (or 536), as shown. In particular examples, the first gate layer 516 (or 546) may be adjacent to a different combination of the vertical electron tunnel structure layers 502-508 (or 532-538), as long as the first gate layer 516 (or 546) is adjacent to portions of the dielectric layer 512 corresponding to the tunneling layer 504 (or 534).

Figure 5J:
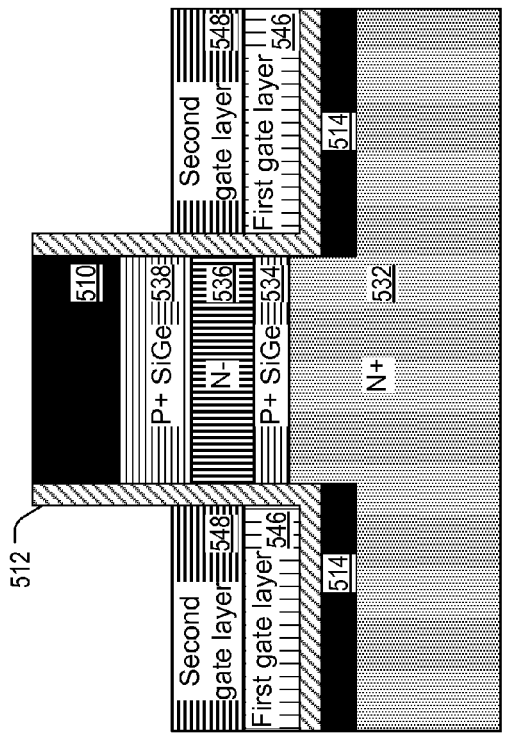
FIG. 5J is a diagram of an tenth stage of the illustrative example of a process of fabricating the transistor of FIG. 1 or FIG. 3.
Figure 5J:
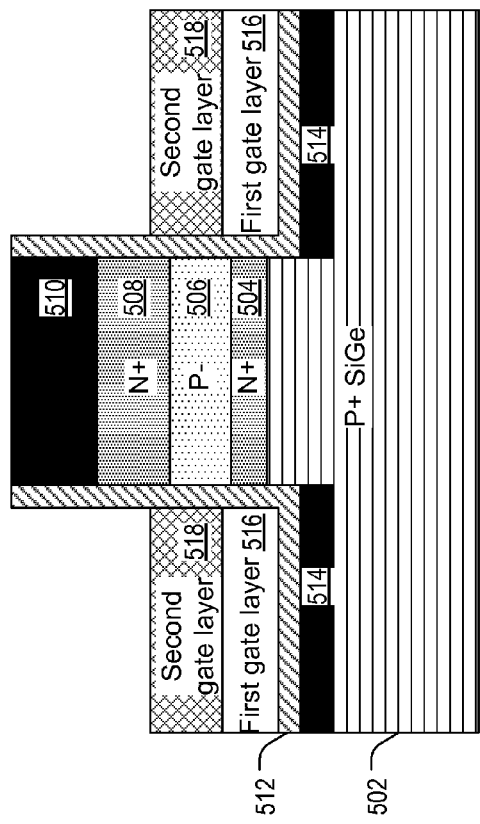

Referring to FIG. 5J, a tenth stage of the first fabrication process is depicted and generally designated 560. FIG. 5J illustrates a second gate layer 518 in the NMOS transistor. The second gate layer 518 may correspond to the second gate layer 118. FIG. 5J further illustrates a second gate layer 548 in the PMOS transistor. The second gate layer 548 may correspond to the second gate layer 318. The second gate layer 518 (or 548) may be deposited (e.g., via physical vapor deposition, chemical vapor deposition, electrochemical deposition, molecular beam epitaxy, atomic layer deposition, etc.) over the first gate layer 516 (or 546). In the illustrated example, the second gate layer 518 (or 548) is adjacent to portions of the dielectric layer 512 corresponding to the channel layer 506 (or 536) and the drain layer 508 (or 538). In particular embodiments, the height of the second gate layer 518 (or 538) is controlled (e.g., via reactive ion etching) after deposition of the second gate layer 518 (or 538).

Figure 5K:
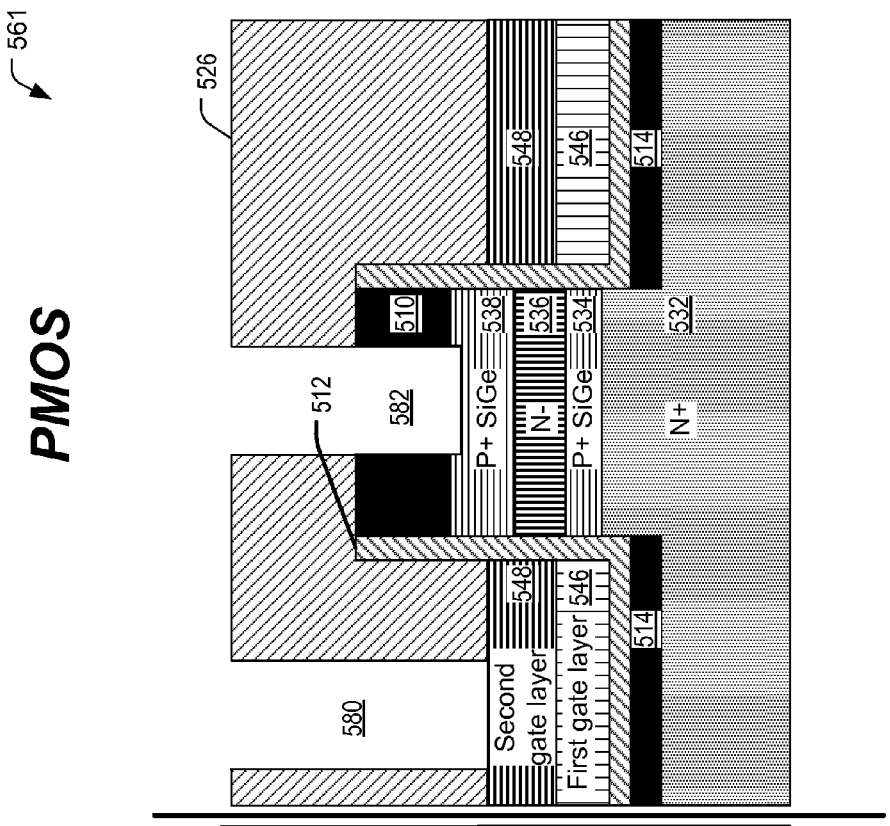
FIG. 5K is a diagram of a eleventh stage of the illustrative example of a process of fabricating the transistor of FIG. 1 or FIG. 3.
Figure 5K:
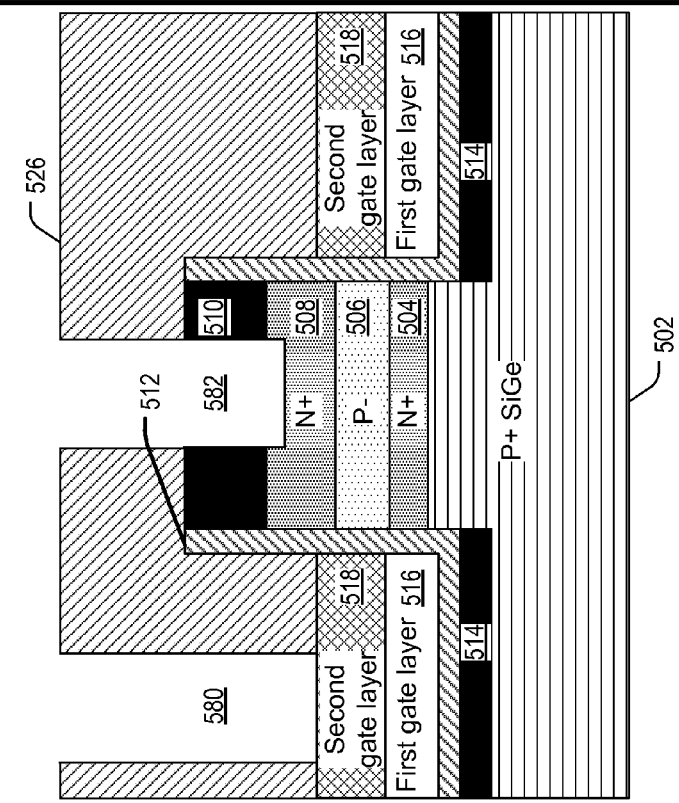

Referring to FIG. 5K, an eleventh stage of the first fabrication process is depicted and generally designated 561. FIG. 5K illustrates a liner layer 526. In the NMOS transistor, the liner layer 526 may correspond to the liner layer 126. In the PMOS transistor, the liner layer 526 may correspond to the liner layer 326. The liner layer 526 may be deposited on the second gate layer 518 (or 548), the dielectric layer 512, and the first hard mask layer 510, as shown. FIG. 5K shows the transistor device after formation of a first cavity 580 and a second cavity 582 in the liner layer 526. The cavities 580, 582 may be formed (e.g., using a dry etch) to accommodate contacts (e.g., source, drain, or gate). Although two cavities are shown, in other examples more or fewer cavities may be formed. In the illustrated example, the first cavity 580 extends through the liner layer 526 to the second gate layer 518 (or 548), as shown, to accommodate a drain contact. The second cavity 582 may extend through the liner layer 526, through the first hard mask layer 510, and into the drain layer 508 (or 538), as shown, to accommodate a gate contact.

Figure 5L:
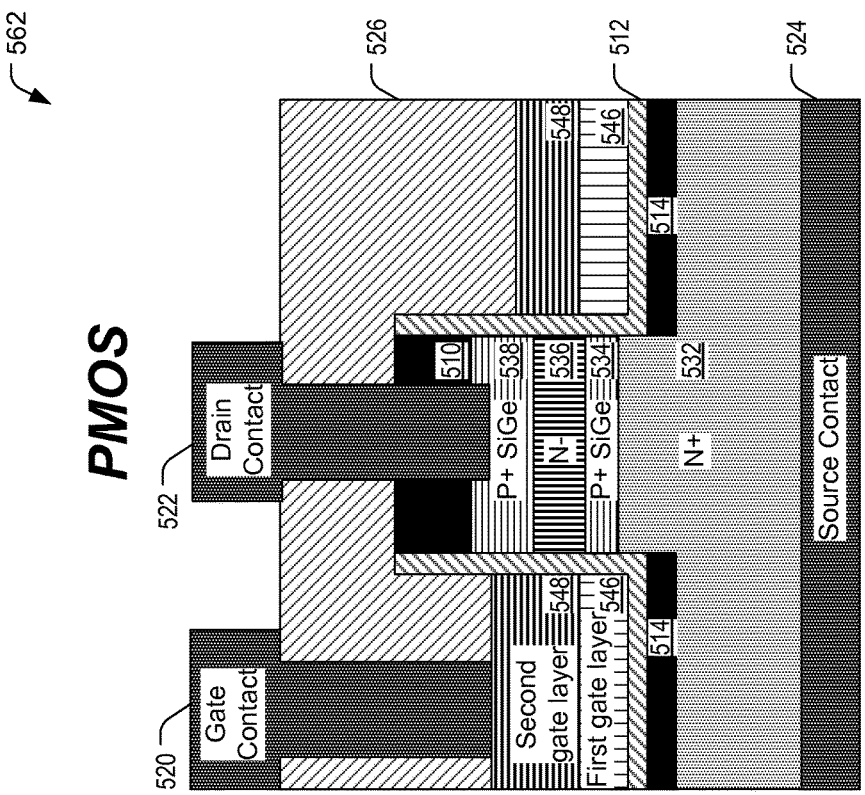
FIG. 5L is a diagram of a twelfth stage of the illustrative example of a process of fabricating the transistor of FIG. 1 or FIG. 3.
Figure 5L:
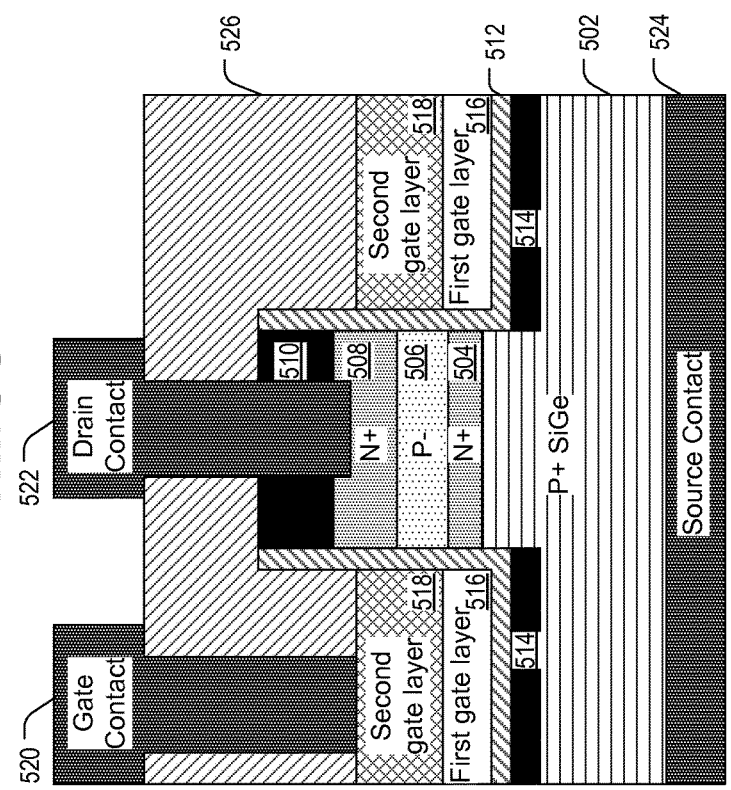

Referring to FIG. 5L, a twelfth stage of the first fabrication process is depicted and generally designated 562. FIG. 5L illustrates a gate contact 520, a drain contact 522, and a source contact 524. In the NMOS transistor, the gate contact 520 may correspond to the gate contact 120, the drain contact 522 may correspond to the drain contact 122, and the source contact 524 may correspond to the source contact 124. In the PMOS transistor, the gate contact 520 may correspond to the gate contact 320, the drain contact 322 may correspond to the drain contact 322, and the source contact 524 may correspond to the source contact 324. It should be noted that while the source contact 524 is shown formed after the stages shown in FIGS. 5A-5K, in other examples, the stages shown in FIGS. 5A-5K may be performed upon the source contact 524 (e.g., a transistor device may be built on the source contact 524). In various examples, one or more of the contacts 520, 522, and 524 may be shaped to meet a variety of form factors. While FIG. 5L shows 3 contacts, various examples may include more contacts. Thus, FIGS. 5A-5L illustrate a first process of fabricating a transistor device (such as the transistor devices 100, 300 of FIGS. 1, 3) that may enable more efficient electron tunneling.

Figure 6A:
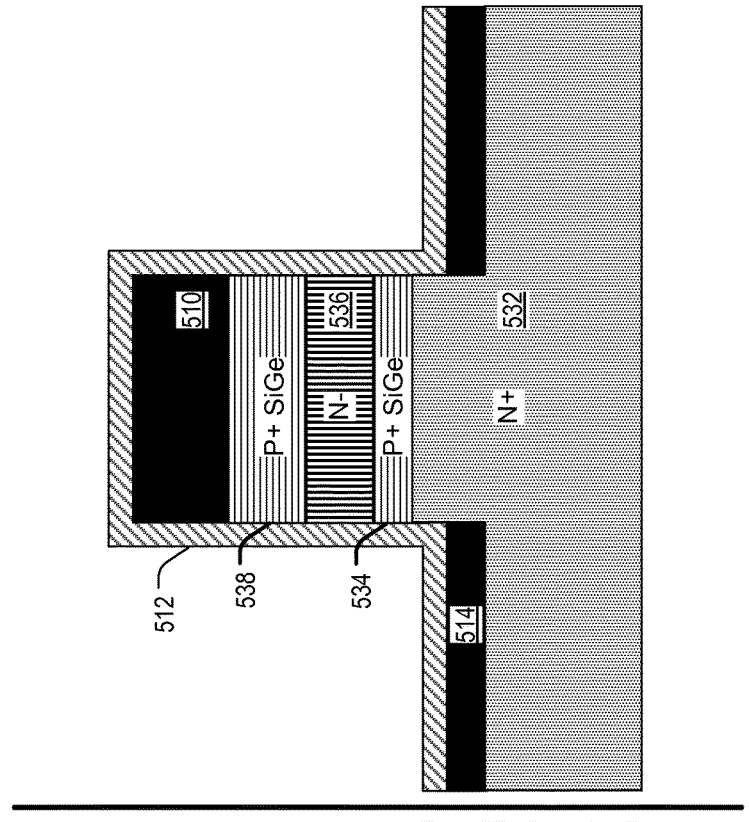
FIG. 6A is a diagram of a sixth stage of an illustrative example of a process of fabricating the transistor of FIG. 2 or FIG. 4 that may include stages 1-5 of the illustrative example of a process of fabricating the transistor of FIG. 1 or FIG. 3.
Figure 6A:
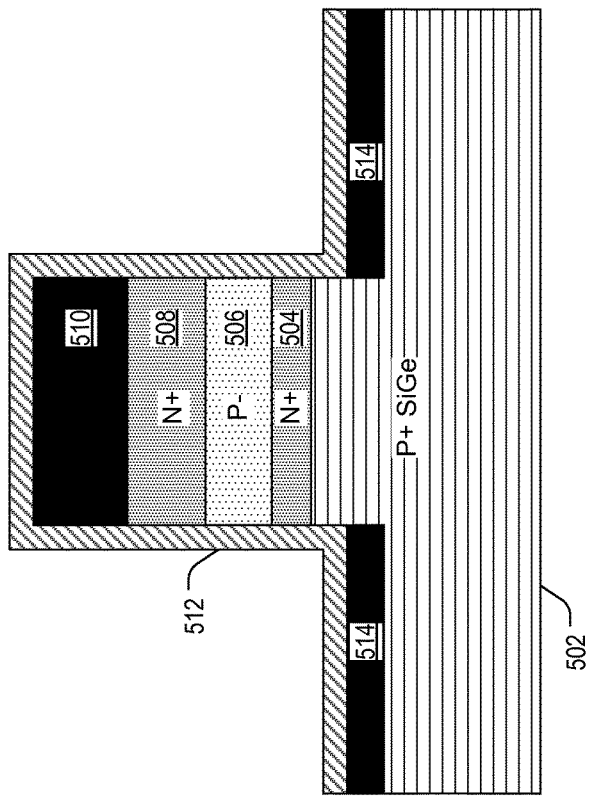

FIGS. 6A-6H illustrate examples of stages of a second fabrication process. The second fabrication process may be used to fabricate an NMOS transistor or a PMOS transistor. In FIGS. 6A-5H, stages of fabricating an NMOS transistor are shown on the left and corresponding stages of fabricating a PMOS transistor are shown on the right. In an illustrative embodiment, the NMOS transistor fabricated using the fabrication process shown on the left side of FIGS. 6A-6H may correspond to the transistor device 200 of FIG. 2. The PMOS transistor fabricated using the fabrication process shown on the right side of FIGS. 6A-6H may correspond to the transistor device 400 of FIG. 4. Transistor devices fabricated using the second fabrication process of FIG. 6 may have a different gate structure than transistor devices fabricated using the first fabrication process of FIG. 5.

Referring to FIG. 6A, a sixth stage of the second fabrication process is depicted and generally designated 651. The second fabrication process may include stages of the first fabrication process. For example, the NMOS fabrication stage shown on the left side of FIG. 6A may follow the stage of the NMOS fabrication process shown on the left side of FIG. 5E. Similarly, the PMOS fabrication stage shown on the right side of FIG. 6A may follow the stage of the PMOS fabrication process shown on the right side of FIG. 5E. FIG. 6A illustrates a dielectric layer 512. In the NMOS device, the dielectric layer 512 may correspond to the dielectric layer 212. In the PMOS device, the dielectric layer 512 may correspond to the dielectric layer 412. The dielectric layer 512 is deposited on the first hard mask layer 510, on the second hard mask layer 514, and along sidewalls of the vertical electron tunnel structure layers 502-508 (or 532-538).

Figure 6B:
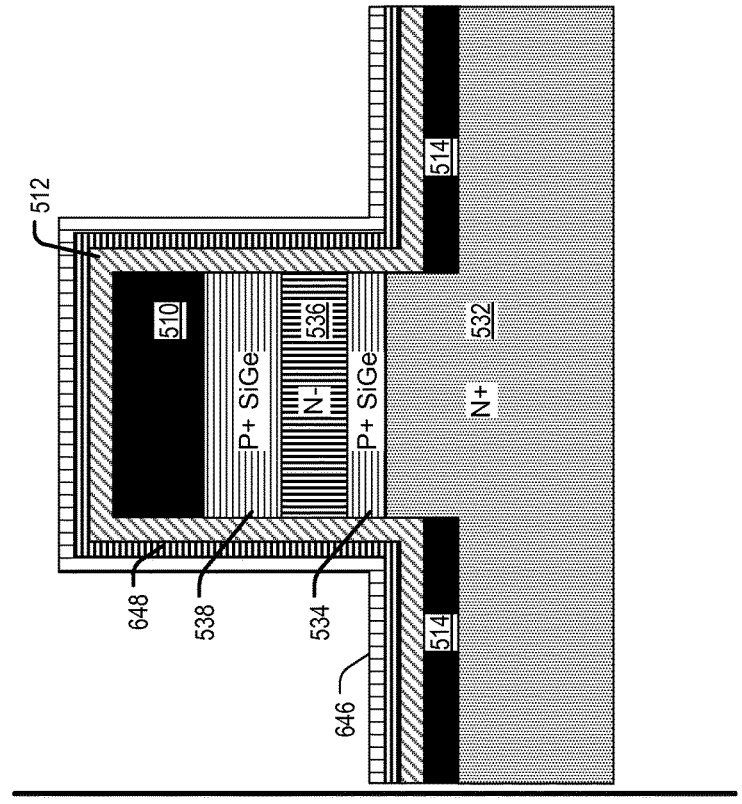
FIG. 6B is a diagram of a seventh stage of the illustrative example of a process of fabricating the transistor of FIG. 2 or FIG. 4.
Figure 6B:
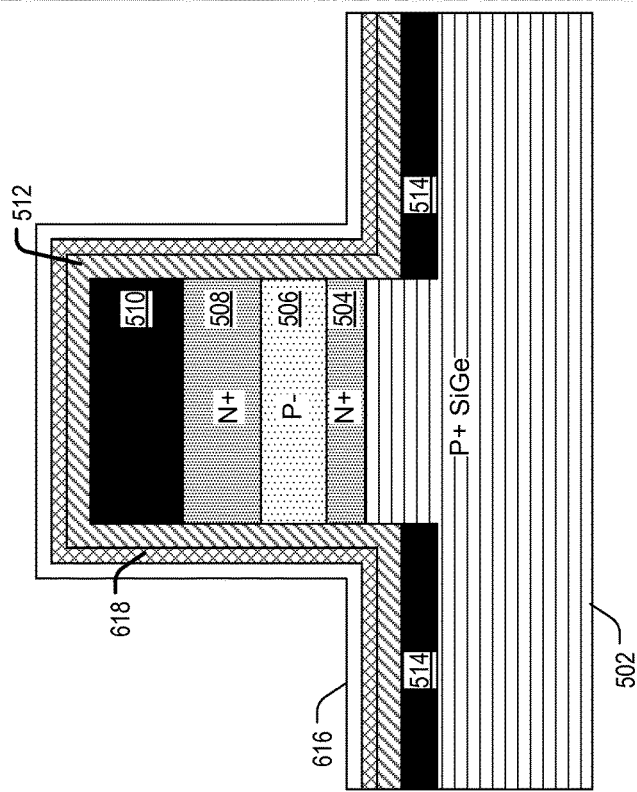

Referring to FIG. 6B, a seventh stage of the second fabrication process is depicted and generally designated 652. FIG. 6B illustrates a first gate layer 616 (e.g., an "Ec" layer) of the NMOS device. The first gate layer 616 may correspond to the first gate layer 216. FIG. 6B further illustrates a second gate layer 618 (e.g., a "mid-gap" layer) of the NMOS device. The second gate layer 618 may correspond to the second gate layer 218. FIG. 6B further illustrates a first gate layer 646 (e.g., an "Ev" layer) of the PMOS transistor. The first gate layer 646 may correspond to the first gate layer 416. FIG. 6B further illustrates a second gate layer 648 (e.g., a "mid-gap" layer) of the PMOS transistor. The second gate layer 648 may correspond to the second gate layer 418.

As shown in FIG. 6B, the second gate layer 618 (or 648) may be deposited on the dielectric layer 612, and the first gate layer 616 (or 646) may be deposited on the second gate layer 618 (or 648).

Figure 6C:
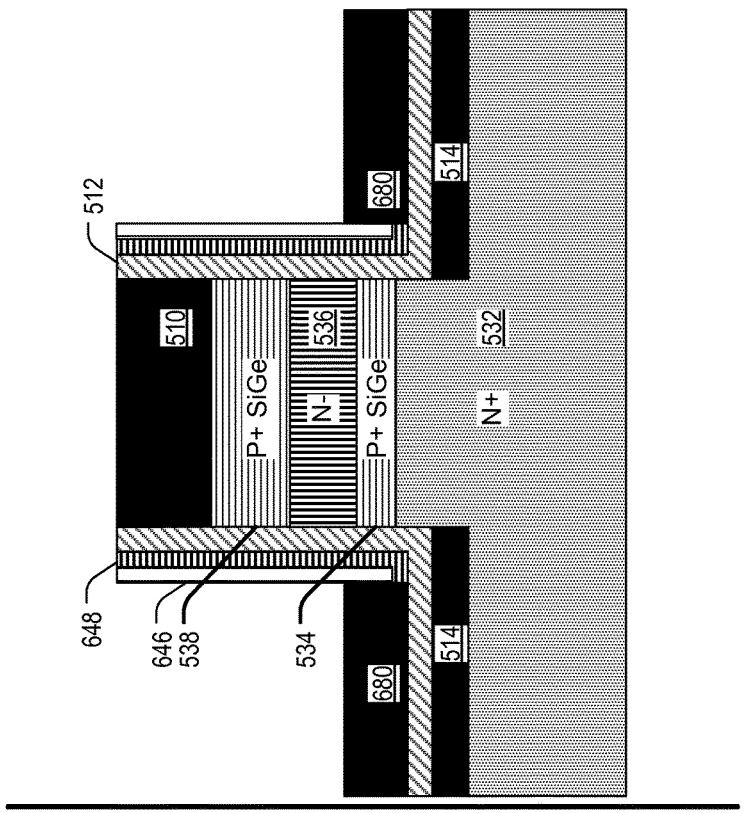
FIG. 6C is a diagram of an eighth stage of the illustrative example of a process of fabricating the transistor of FIG. 2 or FIG. 4.
Figure 6C:
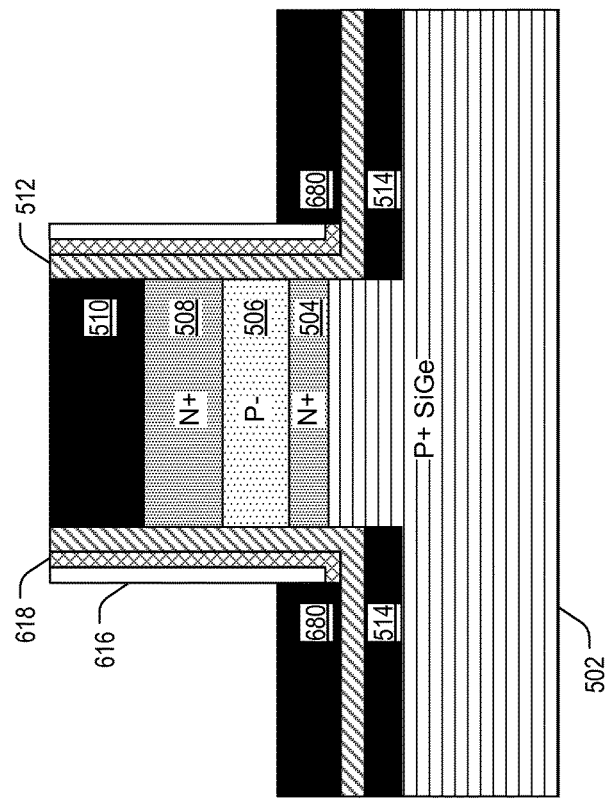

Referring to FIG. 6C, an eighth stage of the second fabrication process is depicted and generally designated 653. FIG. 6C shows the NMOS (or PMOS) transistor after removal (e.g., via etching) of planar gate material from the gate layers 616, 618 (or 646, 648) and after deposition of a first oxide layer 680. In the illustrated example, a portion of the dielectric layer 512 covering the first hard mask layer 510 has also been removed. In alternative embodiments, the portion of the dielectric layer 512 may not be removed. The first oxide layer 680 may be deposited adjacent to the first gate layer 616 (or 646) on one or more sides of the vertical electron tunnel structure, as shown. The height of the first oxide layer 680 may be controlled (e.g., via etching) so that the first oxide layer 680 protects (e.g., prevents from being removed during subsequent stages of the second fabrication process) portions of the first gate layer 616 (or 646) corresponding to the source layer 502 (or 532), the tunneling layer 504 (or 534), and the channel layer 506 (or 536), as shown. In particular examples, the first oxide layer 680 may protect portions of the first gate layer 616 (or 646) as long as portions corresponding to the tunneling layer 504 (or 534) are protected.

Figure 6D:
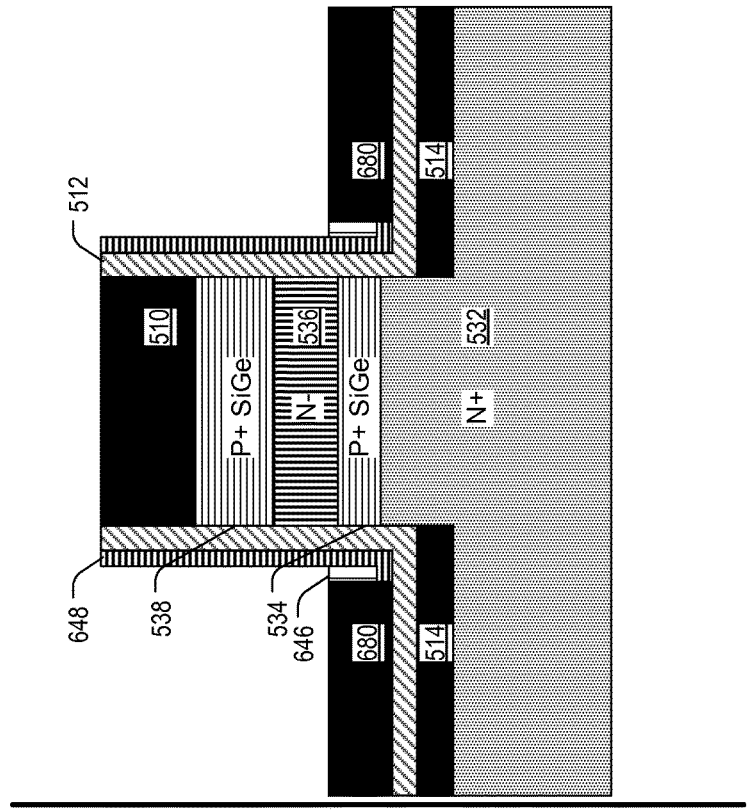
FIG. 6D is a diagram of a ninth stage of the illustrative example of a process of fabricating the transistor of FIG. 2 or FIG. 4.
Figure 6D:
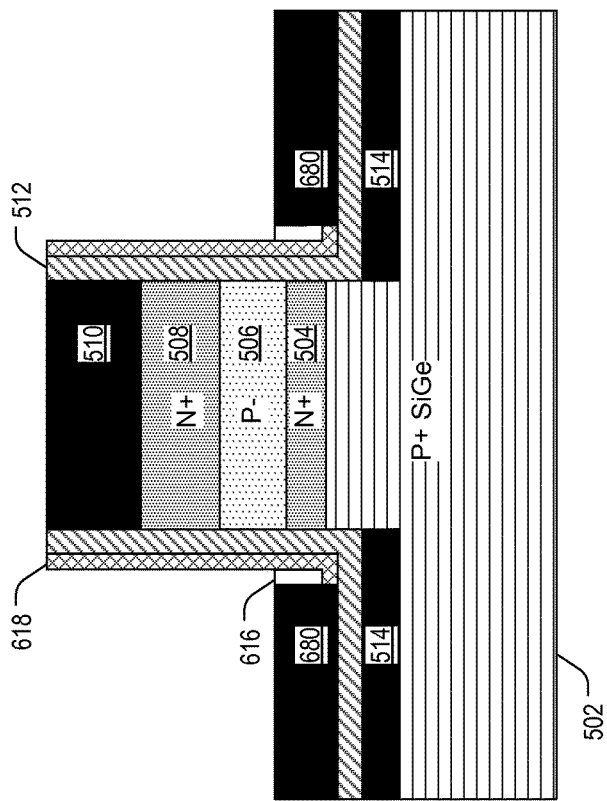

Referring to FIG. 6D, a ninth stage of the second fabrication process is depicted and generally designated 654. FIG. 6D shows the transistor after removal of portions of the first gate layer 616 (or 646). For example, portions of the first gate layer 616 (or 646) not protected by the first oxide layer 680 may be removed (e.g., using a wet etch).

Figure 6E:
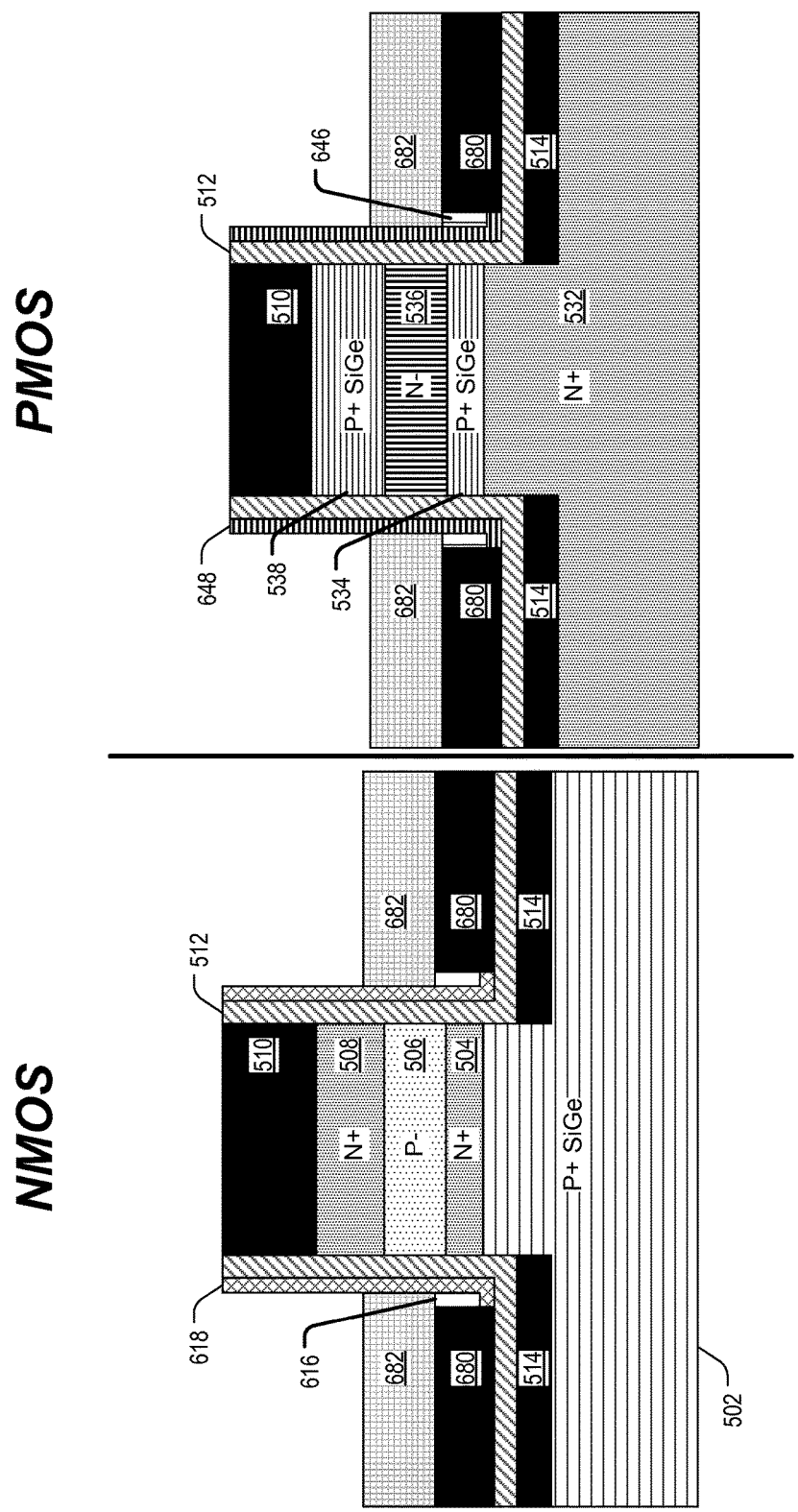
FIG. 6E is a diagram of a tenth stage of the illustrative example of a process of fabricating the transistor of FIG. 2 or FIG. 4.

Referring to FIG. 6E, a tenth stage of the second fabrication process is depicted and generally designated 655. FIG. 6E shows the transistor after deposition of a second oxide layer 682. The second oxide layer 682 may be deposited over the first oxide layer 680 and adjacent to the second gate layer 618 (or 648) on one or more sides of the vertical electron tunnel structure, as shown. The height of the second oxide layer 682 may be controlled so that the second oxide layer 682 protects (e.g., prevents from being removed during subsequent stages of the second fabrication process) portions of the second gate layer 618 (or 648) corresponding to the channel layer 506 (or 536) and the drain layer 508 (or 538), as shown.

Figure 6F:
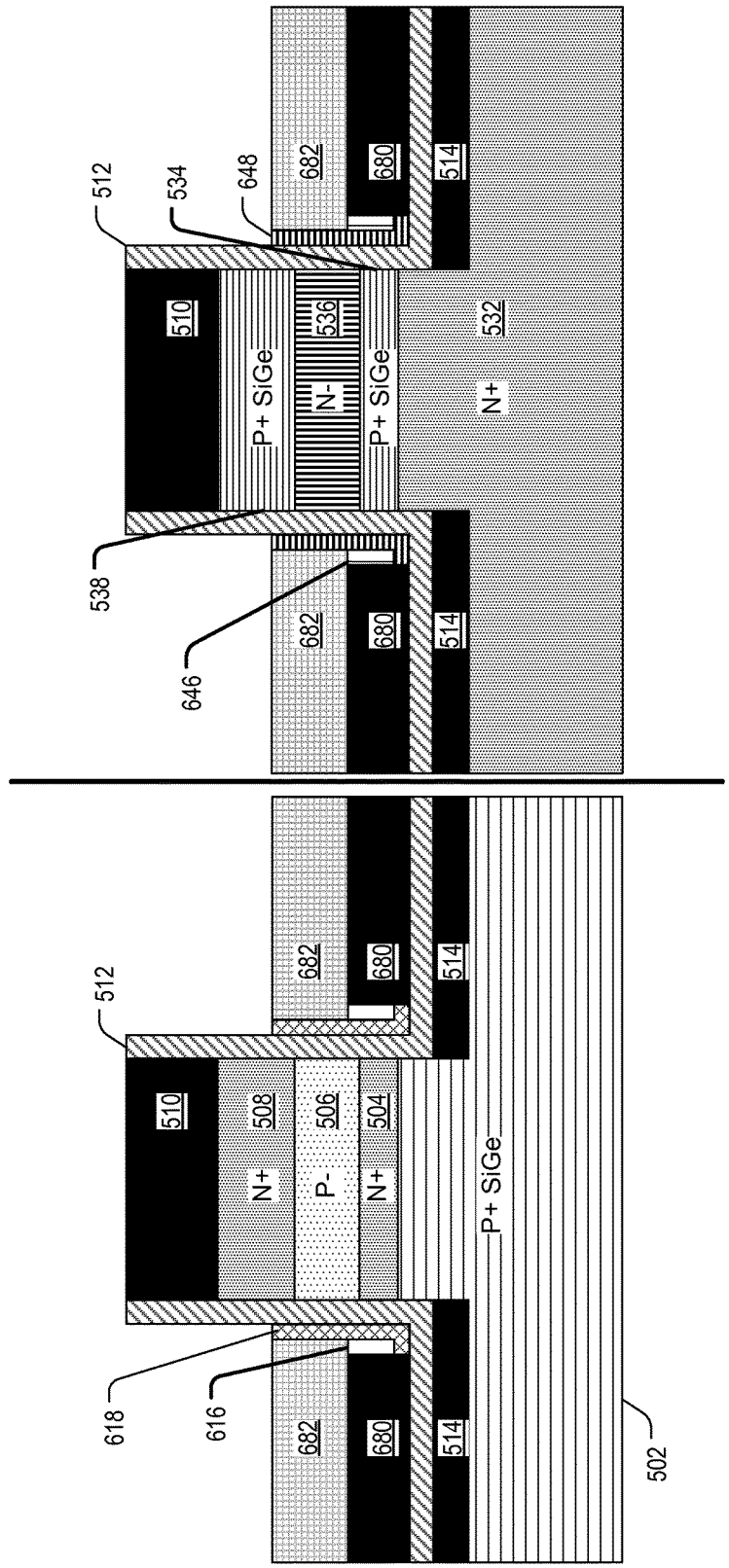
FIG. 6F is a diagram of an eleventh stage of the illustrative example of a process of fabricating the transistor of FIG. 2 or FIG. 4.

Referring to FIG. 6F, an eleventh stage of the second fabrication process is depicted and generally designated 656. FIG. 6F shows the transistor after removal of portions of the second gate layer 618 (or 648). For example, portions of the second gate layer 618 (or 648) not protected by the first oxide layer 680 or the second oxide layer 682 may be removed (e.g., via a chemical etching process), as shown.

Figure 6G:
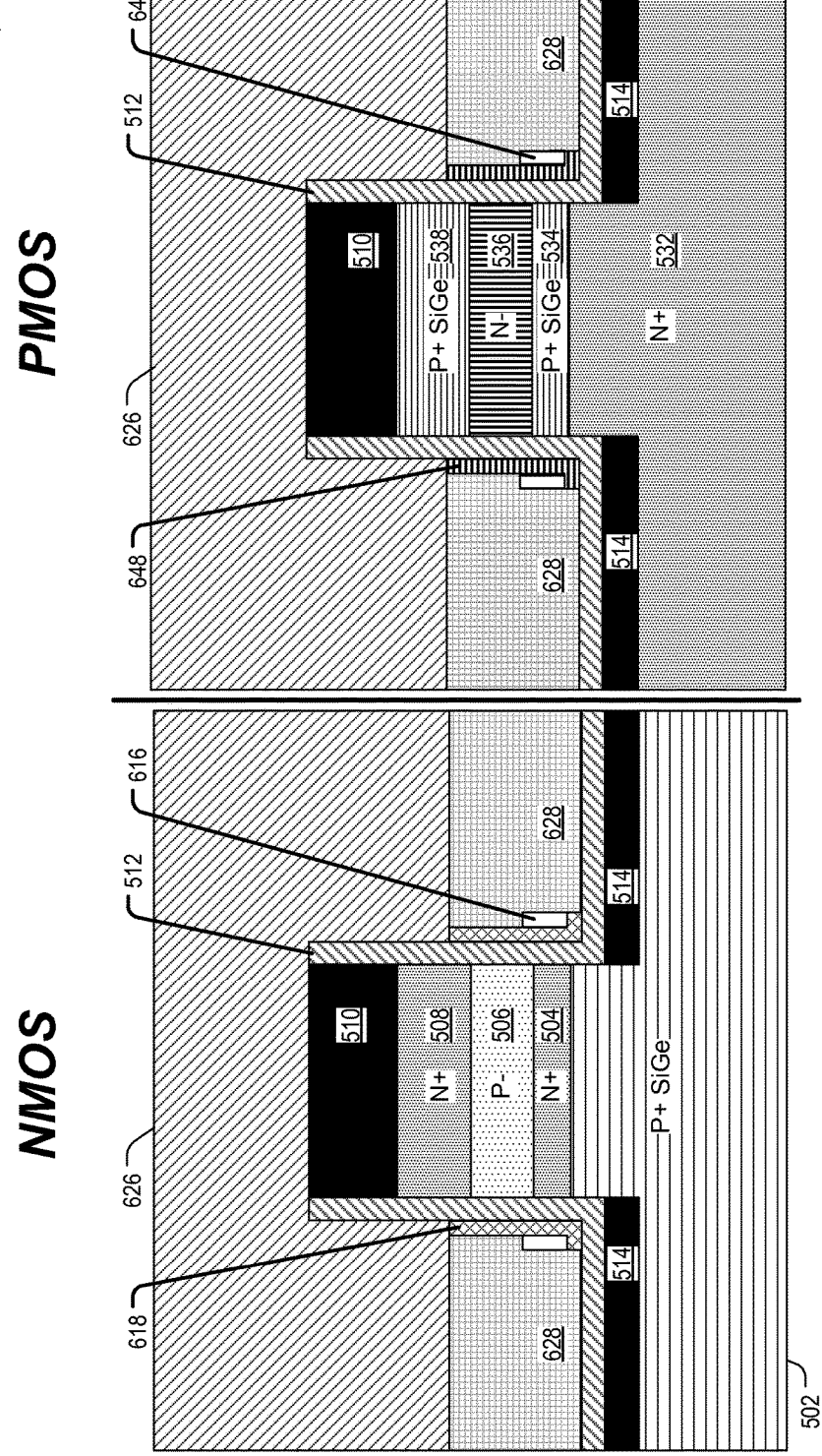
FIG. 6G is a diagram of a twelfth stage of the illustrative example of a process of fabricating the transistor of FIG. 2 or FIG. 4.

Referring to FIG. 6G, a twelfth stage of the second fabrication process is depicted and generally designated 657. FIG. 6G shows the transistor after removal of the first oxide layer 680 and the second oxide layer 682. The transistor includes a metal layer 628 that has been deposited on the dielectric layer 512 and along sidewalls of the first gate layer 616 (or 646) and the second gate layer 618 (or 648). The metal layer 628 may correspond to the metal layer 228 or to the metal layer 428. FIG. 6G further illustrates a liner layer 626. In the NMOS transistor, the liner layer 626 may correspond to the liner layer 126. In the PMOS transistor, the liner layer 626 may correspond to the liner layer 426. The liner layer 626 may be deposited over the metal layer 628, the second gate layer 618 (or 648), the dielectric layer 512, and the first hard mask layer 510, as shown.

Figure 6H:
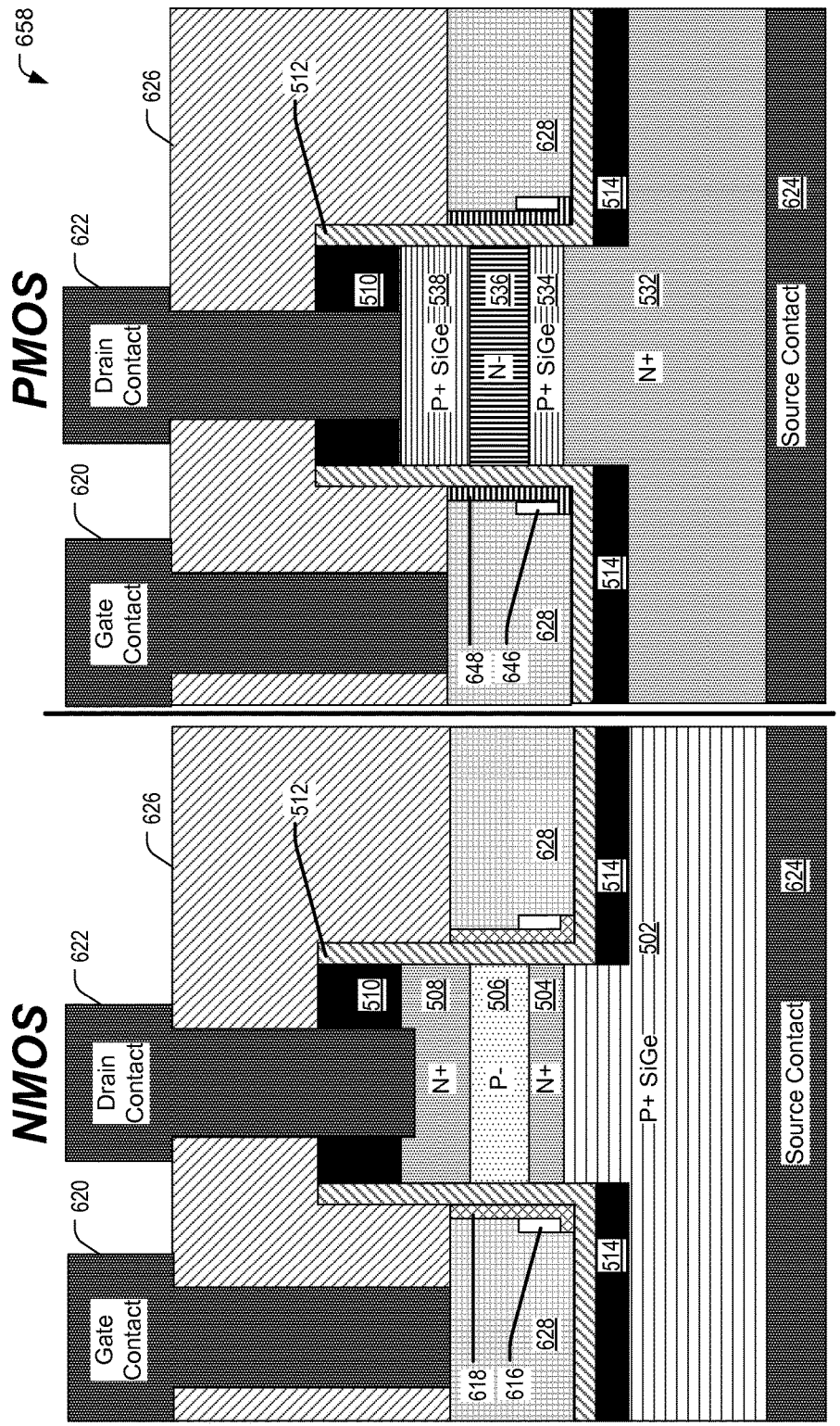
FIG. 6H is a diagram of a thirteenth stage of the illustrative example of a process of fabricating the transistor of FIG. 2 or FIG. 4.

Referring to FIG. 6H, a thirteenth stage of the second fabrication process is depicted and generally designated 658. FIG. 6H illustrates a gate contact 620, a drain contact 622, and a source contact 624. In the NMOS transistor, the gate contact 620 may correspond to the gate contact 220, the drain contact 622 may correspond to the gate contact 222, and the source contact 624 may correspond to the source contact 224. In the PMOS transistor, the gate contact 620 may correspond to the gate contact 420, the drain contact 622 may correspond to the gate contact 422, and the source contact 624 may correspond to the source contact 424. It should be noted that while the source contact 624 is shown formed after the stages shown in FIGS. 6A-6G, in other examples, the stages shown in FIGS. 6A-6G may be performed upon the source contact 624 (e.g., a transistor device may be built on the source contact 624). One or more of the contacts 620, 622, and 624 may be shaped to meet various form factors, as described above. Thus, FIGS. 6A-6H illustrate a second process of fabricating a transistor device (such as the transistor device 200, 400 of FIGS. 2, 4) that may enable more efficient electron tunneling.

Figure 7:
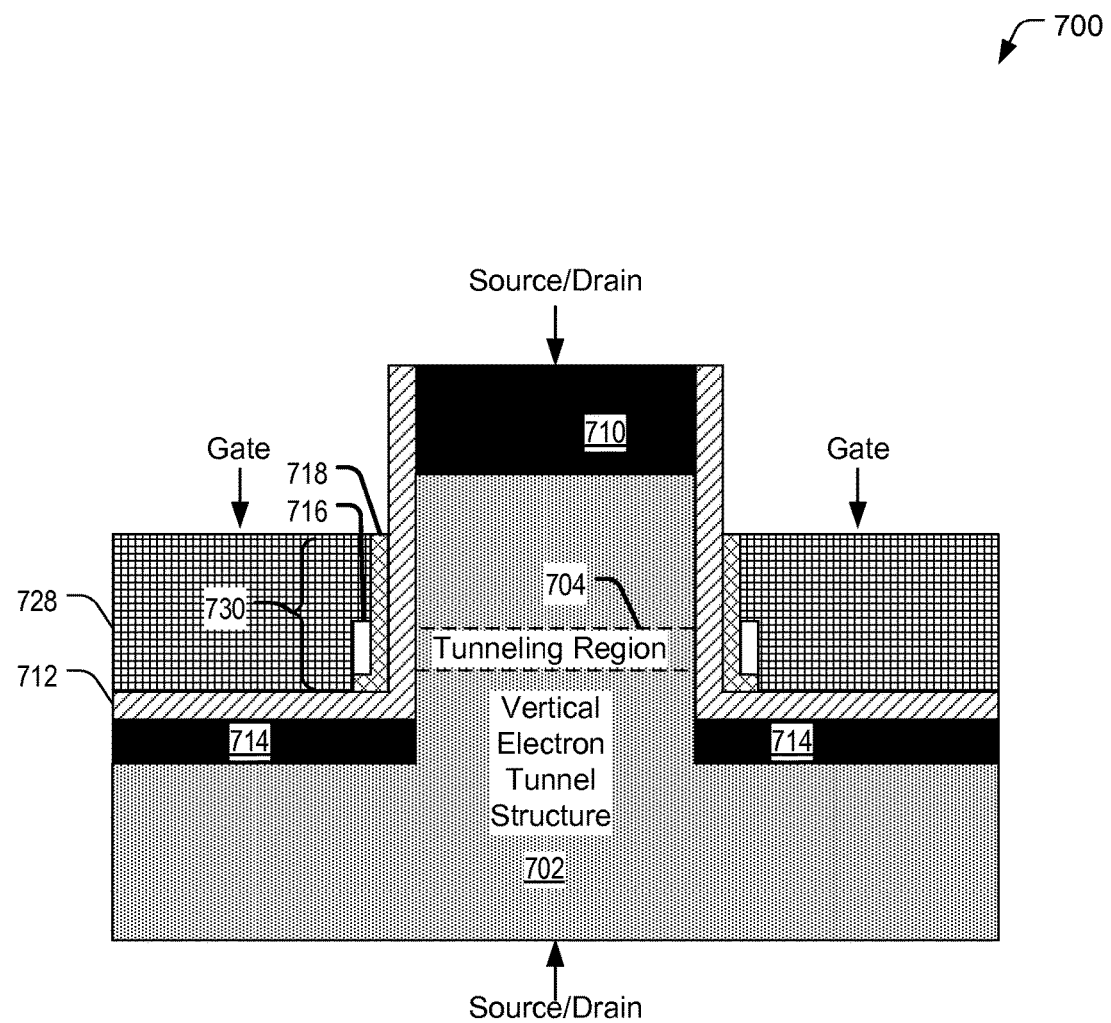
FIG. 7 is a block diagram illustrating another example of a transistor.

Referring to FIG. 7, a block diagram of an example of a transistor device 700 is shown. The transistor device 700 may correspond to either an NMOS device (e.g., the transistor device 200) or to a PMOS device (e.g., the transistor device 400). The transistor device 700 includes a vertical electron tunnel structure 702, a dielectric layer 712, a metal layer 728, and a gate structure 730. The vertical electron tunnel structure 702 is covered by a first hard mask layer 710 and a second hard mask layer 714. The hard mask layers 710, 714 may protect the vertical electron tunnel structure 702 during fabrication of the transistor device 700. For example, the hard mask layers 710, 714 may protect the vertical electron tunnel structure 702 from being etched during an etching process. In a particular example, the hard mask layers 710, 714 include $SiO_2$.

The vertical electron tunnel structure 702 includes a tunneling region 704. The metal layer 728 is coupled to the gate structure 730. When a current/voltage is applied to the metal layer 728, the metal layer 728 may apply current/voltage to the gate structure 730. The gate structure 730 includes a first gate layer 716 and a second gate layer 718. In particular examples, the vertical electron tunnel structure 702 may correspond to vertical electron tunnel structure layers of an NMOS device (e.g., the vertical electron tunnel structure layers 102-108) or to vertical electron tunnel structure layers of a PMOS device (e.g., the vertical electron tunnel structure layers 302-308).

In the illustrated example, the dielectric layer 712 is positioned between the vertical electron tunnel structure 702 and the gate structure 730. Further, the second gate layer 718 is positioned between the first gate layer 716 and the dielectric layer 712. The first gate layer 716 may be positioned so that the first gate layer 716 is aligned with the tunneling region 704, as shown. Layers of the vertical electron tunnel structure 702 may be arranged in a variety of orders (e.g., a source region or a drain region may be above or below the tunneling region 704) with the tunneling region 704 being aligned with the first gate layer 716.

In a particular embodiment, a first work function associated with the first gate layer 716 is different than a second work function associated with the second gate layer 718. The first work function may enable more efficient electron tunneling through the tunneling region 704 than the second work function (e.g., because a band gap between the first gate layer 716 and the tunneling region 704 is less than a band gap between the second gate layer 718 and the tunneling region 704). The second gate layer 718 may enable more efficient electron tunneling in other regions of the vertical electron tunnel structure 702 (e.g., because a band gap between the second gate layer 718 and other regions may be lower). The first work function may be less than the second work function (e.g., in an NMOS transistor device) or the first work function may be greater than the second work function (e.g., in a PMOS transistor device).

The gate structure 730 including the gate layers 716, 718, as shown in FIG. 7, may be more easily fabricated than other split gate structures because heights of the gate layers 716, 718 may be more easily controlled during fabrication (e.g., during the fabrication process illustrated in FIGS. 6A-6H).

Figure 8:
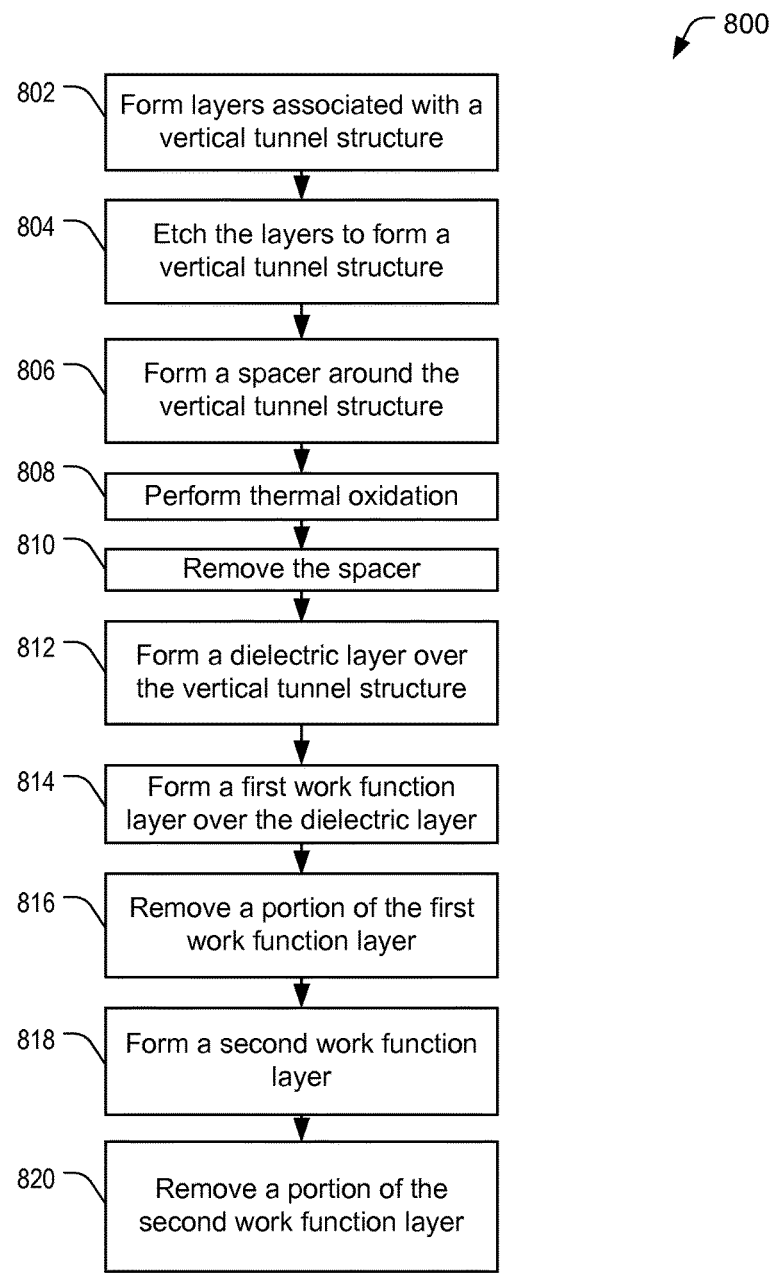
FIG. 8 is a flow chart illustrating a method of fabricating a transistor.

Referring to FIG. 8, a flowchart illustrating a method 800 of fabricating a transistor device is shown. For example, the method 800 may be used to fabricate an NMOS type transistor device, such as the transistor device 100 of FIG. 1, or to fabricate a PMOS type transistor device, such as the transistor device 300 of FIG. 3. The method 800 includes forming layers associated with a vertical electron tunnel structure, at 802. For example, the vertical electron tunnel structure layers 502-508 (or 532-538) may be formed, as shown in FIG. 5A.

The method 800 further includes etching the layers to form a vertical electron tunnel structure, at 804. For example, the vertical electron tunnel structure layers 502-508 (or 532-538) may be shaped (e.g., via reactive ion etching) to form a vertical electron tunnel structure, as shown in FIG. 5B.

The method 800 further includes forming a spacer around the vertical electron tunnel structure, at 806. For example, the spacers 550 may be formed (e.g., via deposition and etching) around the vertical electron tunnel structure layers 502-508 (or 532-538), as shown in FIG. 5C.

The method 800 further includes performing thermal oxidation, at 808. For example, thermal oxidation may be performed to form the second hard mask layer 514, as described with reference to FIG. 5D.

The method 800 further includes removing the spacer, at 810. For example, the spacers 550 may be removed from around the vertical electron tunnel structure layers 502-508 (or 532-538), as described with reference to FIG. 5E.

The method 800 further includes forming a dielectric layer over the vertical electron tunnel structure, at 812. For example, the dielectric layer 512 may be formed over the vertical electron tunnel structure layers 502-508 (or 532-538), as described with reference to FIG. 5F.

The method 800 further includes forming a first work function layer over the dielectric layer, at 814. For example, the first gate layer 516 (or 546) (e.g., corresponding to a material having a first work function) may be formed over the dielectric layer 512, as shown in FIG. 5G. It should be noted that the work function associated with the first gate layer 516 may or may not be equal to the work function associated with the first gate layer 546.

The method 800 further includes removing a portion of the first work function layer, at 816. For example, a first portion of the first gate layer 516 (or 546) may be removed (e.g., via chemical-mechanical planarization), as shown in FIG. 5H. Portions of the dielectric layer 512 may also be removed (e.g., via chemical-mechanical planarization). Additional portions of the first gate layer 516 (or 546) may be removed (e.g., via reactive ion etching) so that the first gate layer 516 (or 546) is adjacent to a portion of the dielectric layer 512 corresponding to the source layer 502 (or 532), the tunneling layer 504 (or 534), and the channel layer 506 (or 536), as shown in FIG. SI.

The method 800 further includes forming a second work function layer, at 818. For example, the second gate layer 518 (or 548) (e.g., corresponding to a material associated with a second work function) may be formed over the first gate layer 516 (or 546), as shown in FIG. 5J. It should be noted that the work function associated with the second gate layer 518 may or may not be equal to the work function associated with the second gate layer 548.

The method 800 further includes removing a portion of the second work function layer, at 820. For example, a portion of the second gate layer 518 (or 548) may be removed (e.g., via reactive ion etching) so that the second gate layer 518 (or 548) is adjacent to a portion of the dielectric layer 512 corresponding to the channel layer 506 (or 536), and the drain layer 508 (or 538), as shown in FIG. 5J.

Thus, the method 800 may be used to fabricate a "green" NMOS transistor, such as the NMOS transistor device 100 of FIG. 1, or a "green" PMOS transistor, such as the PMOS transistor device 300 of FIG. 3. Therefore, the method 800 may enable the fabrication of transistor devices that have more efficient electron tunneling.

Figure 9:
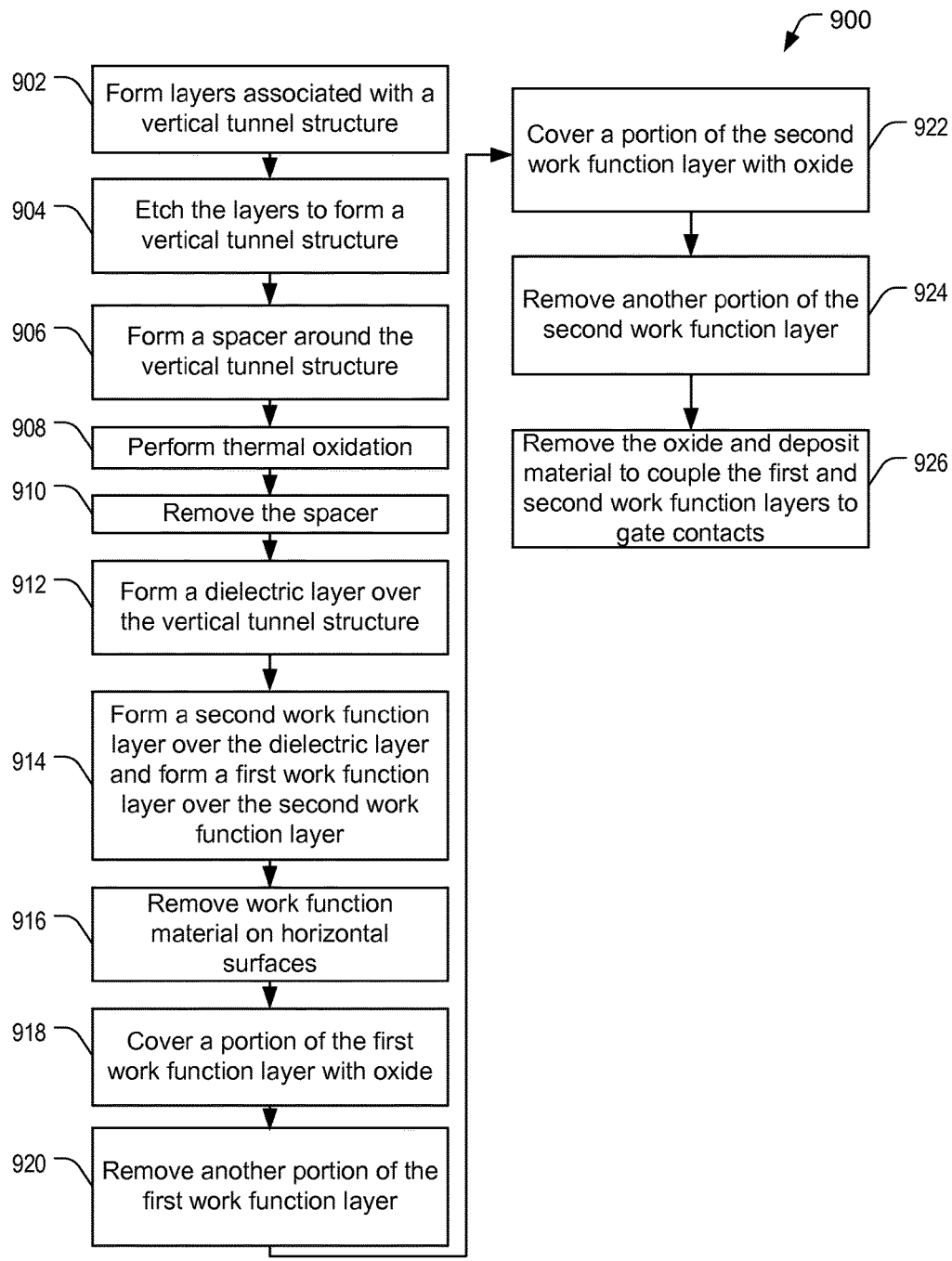
FIG. 9 is a flow chart illustrating another method of fabricating a transistor.

Referring to FIG. 9, a flowchart illustrating another example of a method 900 of fabricating a transistor device is shown. For example, the transistor device may correspond to an NMOS type transistor device, such as the transistor device 200 of FIG. 2, or to a PMOS type transistor device, such as the transistor device 400 of FIG. 4. The method 900 includes forming layers associated with a vertical electron tunnel structure, at 902. For example, the vertical electron tunnel structure layers 502-508 (or 532-538) may be formed, as shown in FIG. 5A.

The method 900 further includes etching the layers to form a vertical electron tunnel structure, at 904. For example, the vertical electron tunnel structure layers 502-508 (or 532-538) may be shaped (e.g., via reactive ion etching) to form a vertical electron tunnel structure, as shown in FIG. 5B.

The method 900 further includes forming a spacer around the vertical electron tunnel structure, at 906. For example, the spacers 550 may be formed (e.g., via deposition and etching) around the vertical electron tunnel structure layers 502-508 (or 532-538), as shown in FIG. 5C.

The method 900 further includes performing thermal oxidation, at 908. For example, thermal oxidation may be performed to form the second hard mask layer 514, as described with reference to FIG. 5D.

The method 900 further includes removing the spacer, at 910. For example, the spacers 550 may be removed from around the vertical electron tunnel structure layers 502-508 (or 532-538), as described with reference to FIG. 5E.

The method 900 further includes, forming a dielectric layer over the vertical electron tunnel structure, at 912. For example, the dielectric layer 512 may be formed over the vertical electron tunnel structure layers 502-508 (or 532-538), as described with reference to FIG. 6A.

The method 900 further includes forming a second work function layer over the dielectric layer and forming a first work function layer over the second work function layer, at 914. For example, the second gate layer 618 (or 648) (e.g., corresponding to a material having a second work function) may be formed over the dielectric layer 512, as shown in FIG. 6B. The first work function layer 616 (or 646) (e.g., corresponding to a material associated with a first work function) may be formed over the second work function layer 618, as shown in FIG. 6B. It should be noted that the work function associated with the first gate layer 616 may or may not be equal to the work function associated with the first gate layer 646. Further the work function associated with the second gate layer 618 may or may not be equal to the work function associated with the second gate layer 648.

The method 900 further includes removing work function material on horizontal surfaces, at 916. For example, portions of the gate layers 616, 618 (or 646, 648) on horizontal surfaces may be removed, as shown in FIG. 6C.

The method 900 further includes covering a portion of the first work function layer with oxide 918. For example, the first oxide layer 680 may be formed so that it protects (e.g., covers) a portion of the first gate layer 616 (or 646) adjacent to a portion of the dielectric layer 512 corresponding to the source layer 502 (or 532), the tunneling layer 504 (or 534), and the channel layer 506 (or 536), as shown in FIG. 6C.

The method 900 further includes removing another portion of the first work function layer, at 920. For example, portions of the first gate layer 616 (or 646) not protected by the first oxide layer 680 may be removed, as shown in FIG. 6D.

The method 900 further includes covering a portion of the second work function layer with oxide, at 920. For example, the second oxide layer 682 may be formed so that it protects (e.g., covers) a portion of the second gate layer 618 (or 648) adjacent to a portion of the dielectric layer 512 corresponding to the channel layer 506 (or 536) and the drain layer 508 (or 538), as shown in FIG. 6E.

The method 900 further includes removing another portion of the second work function layer, at 924. For example, portions of the second gate layer 618 (or 648) that are not protected by the second oxide layer 682 may be removed, as shown in FIG. 6F.

The method 900 further includes removing the oxide and depositing material to couple the first and second work function layers to gate contacts, at 926. For example, the first oxide layer 680 and the second oxide layer 682 may be removed, as shown in FIG. 6G. The metal layer 628 may be formed to couple the first gate layer 616 (or 646) and the second gate layer 618 (or 648) to the gate contacts 620, as shown in FIGS. 6G and 6H.

Thus, the method 900 may be used to fabricate a green NMOS transistor, such as the green NMOS transistor device 200 of FIG. 2, or a green PMOS transistor, such as the green PMOS transistor device 400 of FIG. 4. Therefore, the method 900 may enable the fabrication of transistor devices that have more efficient electron tunneling.

Figure 10:
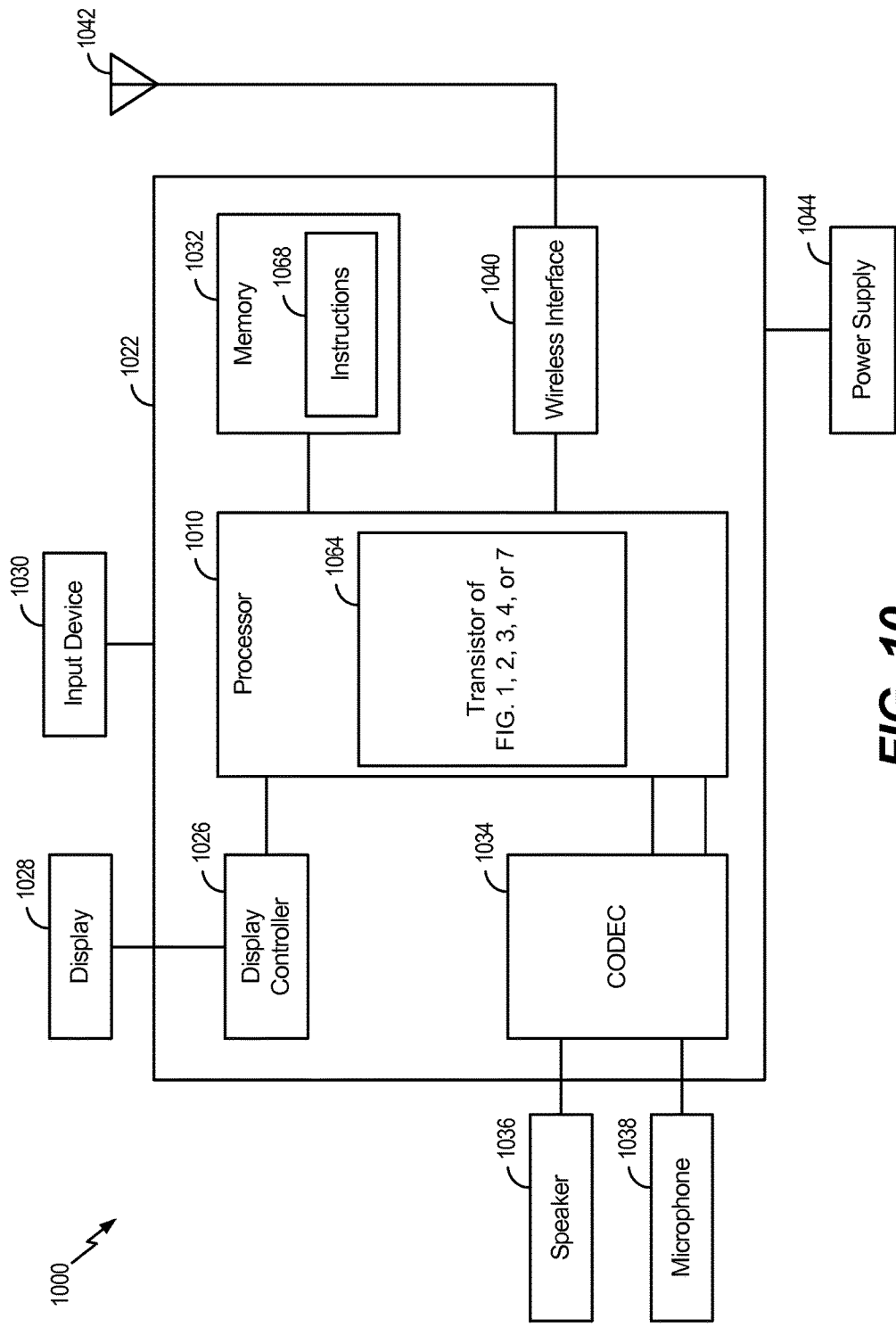
FIG. 10 is a block diagram illustrating an example of a device including a transistor.

Referring to FIG. 10, a block diagram of a particular illustrative embodiment of an electronic device 1000 is depicted. The device 1000 may include the transistor device 100 of FIG. 1, the transistor device 200 of FIG. 2, the transistor device 300 of FIG. 3, the transistor device 400 of FIG. 4, the transistor device 700 of FIG. 7, a transistor device fabricated according to the first fabrication process of FIG. 5, a transistor device fabricated according to the second fabrication process of FIG. 6, a transistor device formed using at least one of the methods of FIGS. 8-9, or a combination thereof.

The device 1000 includes a processor 1010, such as a digital signal processor (DSP), coupled to a memory 1032. The processor 1010 may include a transistor device 1064. For example, the transistor device 1064 may be the transistor device 100 of FIG. 1, the transistor device 200 of FIG. 2, the transistor device 300 of FIG. 3, the transistor device 400 of FIG. 4, the transistor device 700 of FIG. 7, a transistor device fabricated according to the first fabrication process of FIG. 5, a transistor device fabricated according to the second fabrication process of FIG. 6, a transistor device formed using at least one of the methods of FIGS. 8-9, or a combination thereof. While FIG. 10 depicts a single transistor device 1064 within the processor 1010, it should be understood that the processor 1010 may include more than one transistor and have a structure similar to the transistor 1064.

The memory 1032 includes instructions 1068 (e.g., executable instructions) such as computer-readable instructions or processor-readable instructions. The instructions 1068 may include one or more instructions that are executable by a computer, such as the processor 1010.

FIG. 10 also shows a display controller 1026 that is coupled to the processor 1010 and to a display 1028. A coder/decoder (CODEC) 1034 can also be coupled to the processor 1010. A speaker 1036 and a microphone 1038 can be coupled to the CODEC 1034.

FIG. 10 also indicates that a wireless interface 1040, such as a wireless controller, can be coupled to the processor 1010 and to an antenna 1042. In a particular embodiment, the processor 1010, the display controller 1026, the memory 1032, the CODEC 1034, and the wireless interface 1040 are included in a system-in-package or system-on-chip device 1022. In a particular embodiment, an input device 1030 and a power supply 1044 are coupled to the system-on-chip device 1022. Moreover, in a particular embodiment, as illustrated in FIG. 10, the display 1028, the input device 1030, the speaker 1036, the microphone 1038, the antenna 1042, and the power supply 1044 are external to the system-on-chip device 1022. However, each of the display 1028, the input device 1030, the speaker 1036, the microphone 1038, the antenna 1042, and the power supply 1044 can be coupled to a component of the system-on-chip device 1022, such as an interface or a controller. Although the transistor device 1064 is depicted as being included in the processor 1010, the transistor device 1064 may also, or alternatively, be included in another component or in multiple components of the device 1000 or in a component coupled to the device 1000. For example, the transistor device 1064 (or multiple transistors having a structure similar to the transistor device 1064) may be included in the memory 1032, the wireless interface 1040, the power supply 1044, the input device 1030, the display 1028, the display controller 1026, and/or the CODEC 1034.

One or more of the disclosed embodiments may be implemented in an apparatus, such as the device 1000, that may include a mobile device, a tablet, a desktop computer, a laptop computer, a fixed location data unit, a mobile location data unit, or a satellite phone. Alternatively or additionally, the device 1000 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other electronic device, or a combination thereof. As another illustrative, non-limiting example, the system or the apparatus may include remote units, such as hand-held personal communication systems (PCS) units, global positioning system (GPS) enabled devices, navigation devices, fixed location data units such as meter reading equipment, or any other device that stores or retrieves data or computer instructions, or any combination thereof.

In conjunction with the described embodiments of FIG. 1-10, an apparatus is disclosed that may include means for electron tunneling including means for sourcing electrons or electron holes, means for increasing tunneling efficiency of the electrons or the electron holes, means for channeling the electrons or the electron holes, and means for receiving the electrons or the electron holes. The means for increasing and the means for channeling are positioned between the means for sourcing and the means for receiving. The means for electron tunneling may correspond to the stacked vertical electron tunnel layers 102-108 of FIG. 1 or FIG. 2. The means for sourcing may correspond to the source layer 102, the means for increasing may correspond to the tunneling layer 104, the means for channeling may correspond to the channel layer 106, and the means for receiving may correspond to the drain layer 108. Alternatively, the means for electron tunneling may correspond to the stacked vertical electron tunnel layers 302-308 of FIG. 3 or FIG. 4. The means for sourcing may correspond to the source layer 302, the means for increasing may correspond to the tunneling layer 304, the means for channeling may correspond to the channel layer 306, and the means for receiving may correspond to the drain layer 308. The means for electron tunneling may further correspond to the stacked vertical electron tunnel layers 502-508 (or 532-538) shown in FIGS. 5 and 6. The means for sourcing may correspond to the source layer 502 (or 532), the means for increasing may correspond to the tunneling layer 504 (or 534), the means for channeling may correspond to the channel layer 506 (or 536), and the means for receiving may correspond to the drain layer 508 (or 538). The apparatus further includes means for insulating adjacent to the means for electron tunneling. The means for insulating may correspond to the dielectric layer 112, the dielectric layer 212, the dielectric layer 312, the dielectric layer 412 or the dielectric layer 512. The apparatus may further include means for controlling a flow of the electrons or the electron holes from the means for sourcing to the means for draining. The means for controlling may be coupled to the means for insulating. The means for controlling may correspond to the gate structure 130, the gate structure 230, the gate structure 330, the gate structure 430, the gate layers 516, 518, the gate layers 546, 548, the gate layers 616, 618, the gate layers 656, 648, or the gate layers 716, 718.

The foregoing disclosed devices and functionalities may be designed and configured into computer files (e.g. RTL, GDSII, GERBER, etc.) stored on computer-readable media. Some or all such files may be provided to fabrication handlers who fabricate devices based on such files. Resulting products include semiconductor wafers that are then cut into semiconductor die and packaged into a semiconductor chip. The chips are then employed in devices described above.

Although one or more of FIGS. 1-10 may illustrate systems, apparatuses, and/or methods according to the teachings of the disclosure, the disclosure is not limited to these illustrated systems, apparatuses, and/or methods. Embodiments of the disclosure may be suitably employed in any device that includes integrated circuitry including memory, a processor, and on-chip circuitry.

One or more functions or components of any of FIGS. 1-10 as illustrated or described herein may be combined with one or more other portions of another of FIGS. 1-10. Accordingly, no single embodiment described herein should be construed as limiting and embodiments of the disclosure may be suitably combined without departing form the teachings of the disclosure.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
    an electron tunnel structure comprising a tunneling layer, a channel layer, a source layer, and a drain layer, the tunneling layer and the channel layer positioned between the source layer and the drain layer;
    a high-k dielectric layer adjacent to the electron tunnel structure; and
    a gate structure comprising a first gate layer and a second gate layer, the second gate layer positioned between the first gate layer and the electron tunnel structure.

2. The apparatus of claim 1, wherein the tunneling layer and the drain layer have a first doping type, and wherein the source layer and the channel layer have a second doping type that is different from the first doping type.

3. The apparatus of claim 1, wherein the channel layer is formed on top of the tunneling layer, and wherein the high-k dielectric layer is in contact with the source layer, the tunneling layer, the channel layer, and the drain layer.

4. The apparatus of claim 1, wherein a drain contact extends through a liner layer and a hardmask layer to couple the drain layer of the electron tunnel structure.

5. The apparatus of claim 1, further comprising:
    a gate contact coupled to the gate structure;
    a source contact coupled to the electron tunnel structure; and
    a drain contact coupled to the electron tunnel structure.

6. The apparatus of claim 5, further comprising a silicon nitride insulation layer, wherein the gate contact extends through the silicon nitride insulation layer and is in contact with the gate structure.

7. The apparatus of claim 1, wherein the first gate layer comprises a first material associated with a first work function, and wherein the second gate layer comprises a second material associated with a second work function.

8. The apparatus of claim 7, wherein the first material comprises titanium, aluminum, or a combination thereof.

9. The apparatus of claim 7, wherein the first material comprises titanium nitride.

10. The apparatus of claim 7, wherein the second material comprises tungsten, titanium nitride, or a combination thereof.

11. The apparatus of claim 1, further comprising a metal layer coupled to the first gate layer and coupled to the second gate layer.

12. The apparatus of claim 1, wherein one or more of the source layer, the drain layer, the tunneling layer, and the channel layer comprises P+ doped silicon germanium (SiGe).

13. The apparatus of claim 1, wherein the source layer comprises a P+ doped layer, the tunneling layer comprises a first N+ doped layer, the channel layer comprises a P− doped layer, and the drain layer comprises a second N+ doped layer.

14. The apparatus of claim 1, wherein the source layer comprises an N+ doped layer, the tunneling layer comprises a first P+ doped layer, the channel layer comprises an N− doped layer, and the drain layer comprises a second P+ doped layer.

15. A method of forming a tunneling transistor device, the method comprising:
    forming an electron tunnel structure comprising a tunneling layer, a channel layer, a source layer, and a drain layer, wherein the tunneling layer and the channel layer are positioned between the source layer and the drain layer;
    forming a high-k dielectric layer adjacent to the electron tunnel structure; and
    forming a gate structure including a first gate layer and a second gate layer, the second gate layer positioned between the first gate layer and the electron tunnel structure.

16. The method of claim 15, wherein the electron tunnel structure has an N-type metal-oxide-semiconductor (NMOS) configuration or has a P-type metal-oxide semiconductor (PMOS) configuration.

17. The method of claim 15, wherein the electron tunnel structure is formed via epitaxial growth, wherein the tunneling layer is formed on top of the source layer, the channel layer is formed on top of the tunneling layer, the drain layer is formed on top of the channel layer, and wherein the high-k dielectric layer is deposited over the electron tunnel structure.

18. The method of claim 15, wherein the first gate layer includes a first material associated with a first work function and the second gate layer includes a second material associated with a second work function.

19. The method of claim 18, wherein forming the gate structure includes:
    depositing the second material on the high-k dielectric layer and adjacent to a sidewall of the high-k dielectric layer; and
    depositing the first material on the second material and adjacent to a sidewall of the second material.

20. An apparatus comprising:
    means for electron tunneling, the means for electron tunneling including:
        means for sourcing electrons or electron holes;

means for increasing tunneling efficiency of the electrons or the electron holes;
means for channeling the electrons or the electron holes; and
means for receiving the electrons or the electron holes, wherein the means for increasing and the means for channeling are positioned between the means for sourcing and the means for receiving;
means for insulating adjacent to the means for electron tunneling; and
means for controlling a flow of the electrons or the electron holes from the means for sourcing to the means for receiving, the means for controlling coupled to the means for insulating, wherein the means for controlling includes a first gate layer and a second gate layer, the second gate layer positioned between the first gate layer and the means for electron tunneling.

21. The apparatus of claim 20, wherein the means for sourcing or the means for increasing includes silicon germanium (SiGe).

22. The apparatus of claim 20, wherein the means for electron tunneling has an N-type metal-oxide-semiconductor (NMOS) configuration.

23. The apparatus of claim 20, wherein the means for electron tunneling has a P-type metal-oxide-semiconductor (PMOS) configuration.

24. The apparatus of claim 20, wherein the second gate layer comprises tungsten, titanium nitride, or a combination thereof.

25. The apparatus of claim 20, further comprising a metal layer coupled to the first gate layer and the second gate layer.

26. The apparatus of claim 20, wherein the first gate layer includes a first material associated with a first work function and the second gate layer includes a second material associated with a second work function.

27. The apparatus of claim 20, wherein the means for electron tunneling, the means for insulating, and the means for controlling are included in a mobile device.

28. A non-transitory computer readable storage device storing data for enabling fabrication equipment to form a transistor, the data, when used by the fabrication equipment, causing the fabrication equipment to:
  initiate formation of an electron tunnel structure comprising multiple stacked layers including a tunneling layer, a channel layer, a source layer, and a drain layer, the tunneling layer and the channel layer positioned between the source layer and the drain layer;
  initiate formation of a high-k dielectric layer adjacent to the electron tunnel structure; and
  initiate formation of a gate structure including a first gate layer and a second gate layer, the second gate layer positioned between the first gate layer and the electron tunnel structure.

29. The non-transitory computer readable storage device of claim 28, wherein initiating formation of the electron tunnel structure comprises initiating epitaxial growth of the multiple stacked layers, and wherein initiating formation of the high-k dielectric layer comprises initiating deposition of a high-k dielectric material.

30. The apparatus of claim 1, wherein the electron tunnel structure comprises a vertical electron tunnel structure.

* * * * *